United States Patent
Takamine

(10) Patent No.: US 6,717,489 B2
(45) Date of Patent: Apr. 6, 2004

(54) LONGITUDINALLY CONNECTED RESONATOR TYPE SURFACE ACOUSTIC WAVE FILTER

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/891,701

(22) Filed: Jun. 26, 2001

(65) Prior Publication Data

US 2002/0021195 A1 Feb. 21, 2002

(30) Foreign Application Priority Data

Jul. 25, 2000 (JP) .................................... 2000-224270
Apr. 24, 2001 (JP) .................................... 2001-126440

(51) Int. Cl.[7] .............................. H03H 9/64; H03H 9/72
(52) U.S. Cl. ........................ 333/193; 333/133; 333/195; 310/313 B
(58) Field of Search ................... 333/193–196, 333/133; 310/313 B, 313 D

(56) References Cited

U.S. PATENT DOCUMENTS 5,475,348 A * 12/1995 Hode et al. ................ 333/195
5,896,071 A * 4/1999 Dai et al. ................... 333/193
5,994,980 A * 11/1999 Tada .......................... 333/193
6,420,946 B1 * 7/2002 Bauer et al. ............... 333/193

FOREIGN PATENT DOCUMENTS

| JP | 06-204781 | 7/1994 |
| JP | 11-097966 | 4/1999 |
| WO | WO 00/25423 | * 5/2000 |

* cited by examiner

Primary Examiner—Barbara Summons
(74) Attorney, Agent, or Firm—Keating & Bennett, LLP

(57) ABSTRACT

A longitudinally connected resonator type surface acoustic wave filter has a balanced-unbalanced conversion function, achieves a fourfold increase in the input/output impedance, and provides an improved balance degree between balanced terminals. In this longitudinally connected resonator type surface acoustic wave filter, a balanced-unbalanced conversion is achieved using first and second longitudinally connected resonator type surface acoustic wave filters, each having a plurality of IDTs which are successively arranged on a piezoelectric substrate along the propagation direction of a surface acoustic wave, and the duties of electrode fingers in the narrow-pitch electrode finger portion are different between the first and second longitudinally connected resonator type surface acoustic wave filters, whereby the balance degree between a pair of balanced signal terminals is effectively improved.

21 Claims, 19 Drawing Sheets

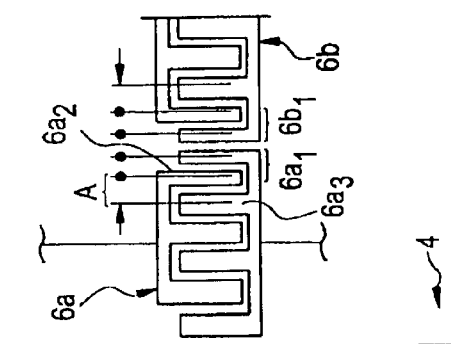
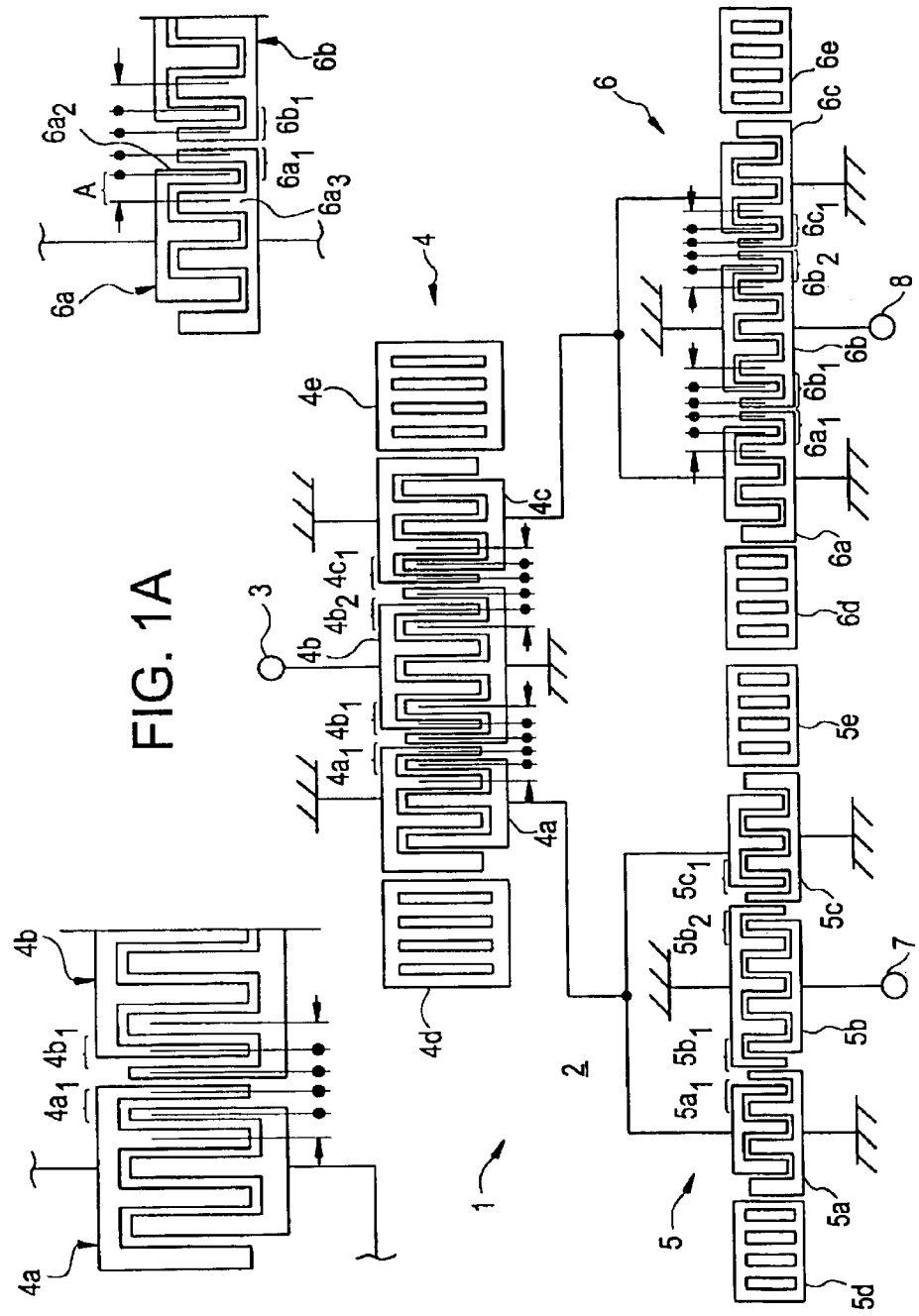

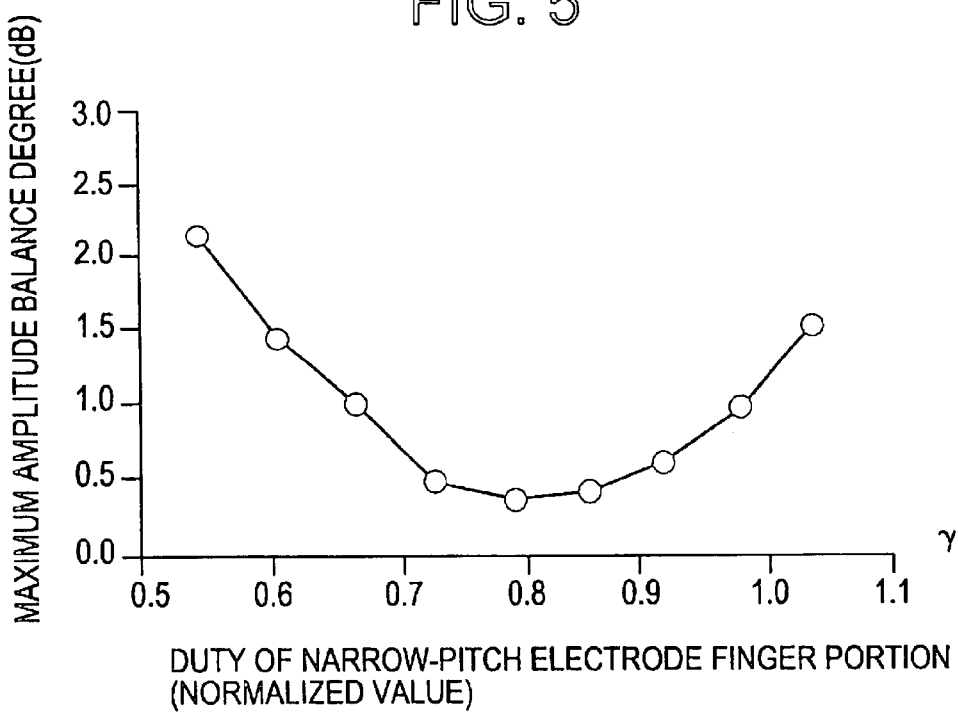
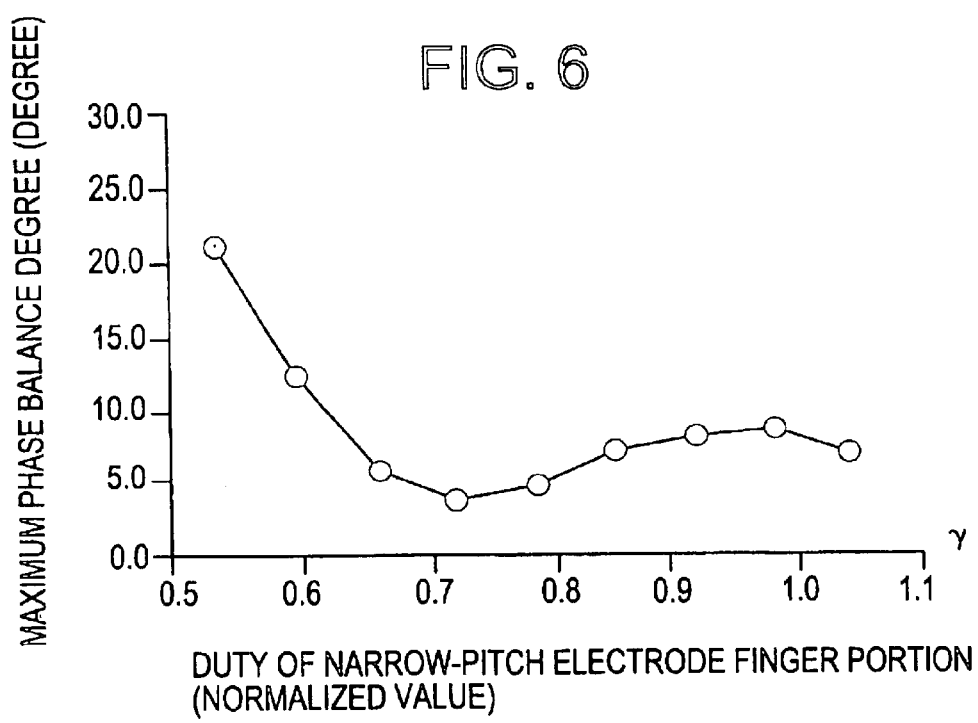

CHANGE AMOUNT OF INTERCENTRAL DISTANCE BETWEEN ELECTRODE FINGERS ($\lambda I$)

CHANGE AMOUNT OF INTERCENTRAL DISTANCE BETWEEN ELECTRODE FINGERS ($\lambda I$)

LONGITUDINALLY CONNECTED RESONATOR TYPE SURFACE ACOUSTIC WAVE FILTER

BACKGROUND OF THE INVENTION

1. Field of the Invention

The present invention relates to a surface acoustic wave filter used as, for example, a band pass filter in a portable telephone, and more particularly, to a longitudinally connected resonator type surface acoustic wave filter.

2. Description of the Related Art

In recent years, advances have been made in the reduction in size and weight of portable telephones. Therefore, a reduction in the number of components defining a portable telephone and miniaturization of the components are required. To meet these requirements, development of components combining a plurality of functions is also progressing.

Surface acoustic filters used at the RF(radio frequency) stage of portable telephones provided with a balanced-unbalanced conversion function, or a balun function, have been developed, and are in use as GSM-type portable telephones.

Such surface acoustic wave filters having a balanced-unbalanced conversion function are disclosed in, for example, Japanese Unexamined Patent Application publication Nos. 6-204781 and 11-97966.

FIG. 22 is a schematic plan view showing the electrode structure of a conventional surface acoustic wave filter having a balanced-unbalanced conversion function.

In this surface acoustic wave filter 100, longitudinally connected resonator type surface acoustic wave filters 101 and 102 are used. These longitudinally connected resonator type surface acoustic wave filters 101 and 102 include three IDTs 101a to 101c, and 102a to 102c, respectively, and reflectors 101d and 101e, and 102d and 102e, respectively.

One-side of the IDTs 101a and 101c of the longitudinally connected resonator type surface acoustic wave filter 101 are commonly connected to an unbalanced signal terminal 104. Likewise, one-side of the IDTs 102a and 102c of the longitudinally connected resonator type surface acoustic wave filter 102 are commonly connected to an unbalanced signal terminal 104.

The central IDTs 101b and 102b of the surface acoustic filters 101 and 102 are connected to balanced signal terminals 105 and 106, respectively.

The phase of the IDT 101b is opposite to that of IDT 102b. Hence, the phases of signals outputted from the terminal 105 and 106 are different from each other by approximately 180°. Thereby, unbalanced signals input from the terminal 104 are transformed into balanced signals, and are output from the terminals 105 and 106.

FIG. 23 is a schematic plan view showing the electrode structure of the surface acoustic wave filter disclosed in Japanese Unexamined Patent Application Publication No. 06-204781. In this surface acoustic wave filter 200, three IDTs 200a to 200c are arranged in the propagation direction of a surface acoustic wave, and reflectors 200d and 200e are disposed on opposite sides of the area where these IDTs 200a to 200c are arranged. The phase of the IDT 200a is opposite to that of the IDT 200c, and thereby the phases of signals output from the terminals 202 and 203 connected to the respective IDTs 200a and 200c are different from each other by approximately 180°. Therefore, unbalanced signals input from an unbalanced terminal 201 connected to the IDT 200b are transformed into balanced signals, and are output from the terminals 202 and 203.

FIG. 24 is a schematic plan view showing the electrode structure of the surface acoustic wave filter disclosed in Japanese Unexamined Patent Application Publication No. 11-97966. In this surface acoustic wave filter 300, IDTs 300a to 300c are arranged in order along the propagation direction of a surface acoustic wave. Also, reflectors 300d and 300e are disposed on opposite sides of the area where these IDTs 300a to 300c are arranged.

Herein, one-side end of the IDTs 300a and 300c are commonly connected to an unbalanced signal terminal 301.

On the other hand, one-side comb electrode of the central IDT 300b is divided into comb electrodes $300b_1$ and $300b_2$, and these comb electrodes $300b_1$ and $300b_2$ are connected to terminals 302 and 303, respectively.

In the surface acoustic wave filter 300, the phase of the IDT 300c is opposite to that of the IDT 300a. Hence, the phases of signals output from the terminal 302 and 303 are different from each other by approximately 180°. Thereby, unbalanced signals input from the terminal 301 are output from the terminals 302 and 303 as balanced signals.

In any of the above-described surface acoustic wave filters 100, 200, and 300, the output impedance is about four times greater than the input impedance. In these surface acoustic wave filters 100, 200, and 300, when switching the positions of the input terminal and the output terminal, the input impedance becomes four times greater than the output impedance. As a result, a filter providing a balanced-unbalanced output is produced.

A filter having a balanced-unbalanced conversion function requires the transmission characteristics in the pass band between an unbalanced signal terminal and one of the balanced terminals to be equal in the amplitude characteristics to, and different in the phase by 180°. from, the transmission characteristics between an unbalanced signal terminal and the other of the balanced terminals. These requirements are called "amplitude balance degree" and "phase balance degree", respectively.

Where a filter device having the above-described balanced-unbalanced conversion function is a three-port device, letting an unbalanced input terminal be port 1, and letting two balanced output terminals be each ports 2 and 3, the amplitude balance degree and the phase balance degree is defined as follows:

Amplitude balance degree=$|A|$, $A=|20 \cdot \log(S21)|-|20 \cdot \log(S31)|$

Phase balance degree=$|B-180|$, $B=|\angle S21-\angle S31|$

Ideal values of the amplitude balance degree and the phase balance degree in the pass band of the filter, are considered to be 0 dB for the amplitude balance degree, and 0° for the phase balance degree. The current market demand for the amplitude balance degree is about 2.0 dB, and that for the phase amplitude balancing is about 20°.

In reality, however, in any of the surface acoustic wave filters 100, 200, and 300, deviations exist in the above-described balance degrees, and therefore the balance degrees are not sufficient for practical use.

This is because, in the surface acoustic wave filter 100, the electrode fingers of the IDT 101b adjacent to the IDTs 101a and 101c define a ground electrode, whereas the electrode fingers of the IDT 102b adjacent to the IDTs 102a and 102c define a signal electrode, thereby causing significant differences in the frequency characteristics between the surface acoustic wave filter 101 and 102.

FIG. 25 shows the differences in the frequency characteristics between the surface acoustic wave filters 101 and 102 in the surface acoustic wave filter 100 shown in FIG. 22. In FIG. 25, the solid lines show the frequency characteristics of the surface acoustic wave filters 101, and the broken lines show those of the surface acoustic wave filters 102. In any of the surface acoustic wave filters 101 and 102, impedance matching has been achieved with 100 Ω. In the figure, the right side scale of the vertical axis shows enlarged frequency characteristics.

As can be seen from FIG. 25, the frequency characteristics of the surface acoustic wave filters 101 and 102 differ greatly. Particularly on the higher frequency side of the pass band range, a significant difference is observed. This difference is a large factor contributing to the deterioration of the above-described balance degrees, when a surface acoustic wave device having a balanced-unbalanced conversion function is made using the surface acoustic wave 101 and 102.

Also, in each of the surface acoustic wave filters 200 and 300, since the polarities of the IDTs on the left and right sides adjacent to the central IDT are different from each other, a difference in the frequency characteristics exists between the pair of balanced signal terminals, and the balance degrees deteriorate just as in the case of the surface acoustic wave filters 100.

SUMMARY OF THE INVENTION

To overcome the problems described above, preferred embodiments of the present invention provide a longitudinally connected resonator type surface acoustic wave filter having a balanced-unbalanced conversion function, a fourfold increase in input/output impedance, and greatly improved balance degrees between balanced terminals.

In accordance with a first preferred embodiment of the present invention, a longitudinally connected resonator type surface acoustic wave filter includes first and second longitudinally connected resonator type surface acoustic wave filters each having a plurality of IDTs which are successively arranged on a piezoelectric substrate along the propagation direction of a surface acoustic wave, wherein the first longitudinally connected resonator type surface acoustic wave filter has a transmission phase that is substantially opposite that of the second longitudinally connected resonator type surface acoustic wave filter, wherein first terminals of the first and second longitudinally connected resonator type surface acoustic wave filters are each configured as unbalanced terminals by being connected in parallel with each other, and second terminals of the first and second longitudinally connected resonator type surface acoustic wave filters are each configured as balanced terminals via a ground or by being connected in series with each other, whereby this longitudinally connected resonator type surface acoustic wave filter has a balanced-unbalanced conversion function, wherein, in the first and second longitudinally connected resonator type surface acoustic wave filters, each of the plurality of IDTs has a narrow-pitch electrode finger portion in which the pitch of one electrode finger portion from the adjacent IDT-side end of each of the IDTs is narrower than that of the other electrode finger portion of the IDT, and wherein the duty of the electrode fingers in the narrow-pitch electrode finger portion is different between the first and second longitudinally connected resonator type surface acoustic wave filters.

In accordance with a second preferred embodiment of the present invention, a longitudinally connected resonator type surface acoustic wave filter includes first and second longitudinally connected resonator type surface acoustic wave filters each having a plurality of IDTs which are successively arranged on a piezoelectric substrate along the propagation direction of a surface acoustic wave, wherein the first longitudinally connected resonator type surface acoustic wave filter has a transmission phase that is substantially opposite to that of the second longitudinally connected resonator type surface acoustic wave filter, wherein first terminals of the first and second longitudinally connected resonator type surface acoustic wave filters are each configured as unbalanced terminals by being connected in parallel with each other, and second terminals of the first and second longitudinally connected resonator type surface acoustic wave filters are each configured as balanced terminals via a ground or by being connected in series with each other, whereby the longitudinally connected resonator type surface acoustic wave filter has a balanced-unbalanced conversion function, wherein, in the first and second longitudinally connected resonator type surface acoustic wave filters, each of the plurality of IDTs has a narrow-pitch electrode finger portion in which the pitch of one electrode finger portion from the adjacent IDT-side end of each of the IDTs is narrower than that of the other electrode finger portion of the IDT, and wherein the pitch of the electrode fingers in the narrow-pitch electrode finger portion is different between the first and second longitudinally connected resonator type surface acoustic wave filters.

In accordance with a third preferred embodiment of the present invention, a longitudinally connected resonator type surface acoustic wave filter includes first and second longitudinally connected resonator type surface acoustic wave filters each having a plurality of IDTs which are successively arranged on a piezoelectric substrate along the propagation direction of a surface acoustic wave, wherein the first longitudinally connected resonator type surface acoustic wave filter has a transmission phase that is substantially opposite to that of the second longitudinally connected resonator type surface acoustic wave filter, wherein first terminals of the first and second longitudinally connected resonator type surface acoustic wave filters are each configured as unbalanced terminals by being connected in parallel with each other, and second terminals of the first and second longitudinally connected resonator type surface acoustic wave filters are each configured as balanced terminals via a ground or by being connected in series with each other, whereby this longitudinally connected resonator type surface acoustic wave filter has a balanced-unbalanced conversion function, wherein, in the first and second longitudinally connected resonator type surface acoustic wave filters, each of the plurality of IDTs has a narrow-pitch electrode finger portion in which the pitch of one electrode finger portion from the adjacent IDT-side end of each of the IDTs is narrower than that of the other electrode finger portion of the IDT, and wherein the distance between the central axes two adjacent electrode fingers is different between the first and second longitudinally connected resonator type surface acoustic wave filters, at least at one location.

In accordance with a fourth preferred embodiment of the present invention, a longitudinally connected resonator type surface acoustic wave filter includes first and second longitudinally connected resonator type surface acoustic wave filters each having a plurality of IDTs which are successively arranged on a piezoelectric substrate along the propagation direction of a surface acoustic wave, wherein the first longitudinally connected resonator type surface acoustic wave filter has a transmission phase that is substantially opposite of the second longitudinally connected resonator type surface acoustic wave filter, wherein first terminals of the first and second longitudinally connected resonator type surface acoustic wave filters are each configured as unbalanced terminals by being connected in parallel with each other, and second terminals of the first and second longitudinally connected resonator type surface acoustic wave filters are each configured as balanced terminals via a ground or by being connected in series with each other, whereby this longitudinally connected resonator type surface acoustic wave filter has a balanced-unbalanced conversion function, wherein, in the first and second longitudinally connected resonator type surface acoustic wave filters, each of the plurality of IDTs has a narrow-pitch electrode finger portion in which the pitch of one electrode finger portion from the adjacent IDT-side end of each of the IDTs is narrower than that of the other electrode finger portion of the IDT, and wherein the distance between the central axes of two adjacent electrode fingers between adjacent IDTs, and/or the distance between the central axes of two adjacent electrode fingers between the narrow-pitch electrode finger portion and the remaining electrode finger portion, are different between the first and second longitudinally connected resonator type surface acoustic wave filters.

In accordance with a fifth preferred embodiment of the present invention, a longitudinally connected resonator type surface acoustic wave filter includes first and second longitudinally connected resonator type surface acoustic wave filters each having a plurality of IDTs which are successively provided on a piezoelectric substrate along the propagation direction of a surface acoustic wave, wherein the first longitudinally connected resonator type surface acoustic wave filter has a transmission phase that is substantially opposite to that of the second longitudinally connected resonator type surface acoustic wave filter, wherein first terminals of the first and second longitudinally connected resonator type surface acoustic wave filters are each configured as unbalanced terminals by being connected in parallel with each other, and second terminals of the first and second longitudinally connected resonator type surface acoustic wave filters are each configured as balanced terminals via a ground or by being connected in series with each other, whereby this longitudinally connected resonator type surface acoustic wave filter has a balanced-unbalanced conversion function, wherein, in the first and second longitudinally connected resonator type surface acoustic wave filters, each of the plurality of IDTs has a narrow-pitch electrode finger portion in which the pitch on one electrode finger portion from the adjacent IDT-side end of each of the IDTs is narrower than that of the other electrode finger portion of the IDT, and wherein the longitudinally connected resonator type surface acoustic wave filter further includes at least two of the following features (a) to (d):

(a) the duty of the electrode fingers in the narrow-pitch electrode finger portion is different between the first and second longitudinally connected resonator type surface acoustic wave filters;

(b) the pitch of the electrode fingers in the narrow-pitch electrode finger portion is different between the first and second longitudinally connected resonator type surface acoustic wave filters;

(c) the distance between central axes of two adjacent electrode fingers is different between the first and second longitudinally connected resonator type surface acoustic wave filters, at at least one location; and (d) the distance between central axes of the two adjacent electrode fingers between adjacent IDTs, and/or the distance between central axes of the two adjacent electrode fingers between the narrow-pitch electrode finger portion and the remaining electrode finger portion, are different between the first and second longitudinally connected resonator type surface acoustic wave filters.

In accordance with a sixth preferred embodiment of the present invention, a longitudinally connected resonator type surface acoustic wave filter includes first and second longitudinally connected resonator type surface acoustic wave filters each having a plurality of IDTs which are successively arranged on a piezoelectric substrate along the propagation direction of a surface acoustic wave, wherein the first longitudinally connected resonator type surface acoustic wave filter has a transmission phase that is substantially opposite to that of the second longitudinally connected resonator type surface acoustic wave filter, wherein first terminals of the first and second longitudinally connected resonator type surface acoustic wave filters are each configured as unbalanced terminals by being connected in parallel with each other, and second terminals of the first and second longitudinally connected resonator type surface acoustic wave filters are each configured as balanced terminals via a ground or by being connected in series with each other, whereby this longitudinally connected resonator type surface acoustic wave filter has a balanced-unbalanced conversion function wherein, in the first and second longitudinally connected resonator type surface acoustic wave filters, each of the plurality of IDTs has a chirp type electrode finger portion in which the pitch of one electrode finger portion from the adjacent IDT-side end of each of the IDTs is linearly changed along the propagation direction of a surface acoustic wave, and wherein the configuration of the chirp type electrode finger portion is different between the first and second longitudinally connected resonator type surface acoustic wave filters.

In accordance with a seventh preferred embodiment of the present invention, a longitudinally connected resonator type surface acoustic wave filter includes first to third IDTs which are successively arranged on a piezoelectric substrate along the propagation direction of a surface acoustic wave, wherein the first and third IDTs have an opposite phase to that of the second IDT, and an unbalanced terminal extends from the second IDT, while an balanced terminal extends from each of the first and third IDTs, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of each of the IDTs is narrower than that of the other electrode finger portion of the IDT, and wherein the duty of the electrode fingers in the narrow-pitch electrode finger portion is different between the portion where the first and second IDTs are adjacent to each other, and the portion where the second and third IDTs are adjacent to each other.

In accordance with an eighth preferred embodiment of the present invention, a longitudinally connected resonator type surface acoustic wave filter includes first to third IDTs which are successively arranged on a piezoelectric substrate along the propagation direction of a surface acoustic wave, wherein the first and third IDTs have an opposite phase to that of the second IDT, and an unbalanced terminal extends from the second IDT, while a balanced terminals extends from each of the first and third IDTs, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of each of the IDTs is narrower than that of the other electrode finger portion of the IDT, and wherein the pitch of the electrode fingers in the narrow-pitch electrode finger portion is different between the portion where the first and second IDTs are adjacent to each other, and the portion where the second and third IDTs are adjacent to each other.

In accordance with a ninth preferred embodiment of the present invention, a longitudinally connected resonator type surface acoustic wave filter includes first to third IDTs which are successively arranged on a piezoelectric substrate along the propagation direction of a surface acoustic wave, wherein the first and third IDTs have an opposite phase to that of the second IDT, and an unbalanced terminal extends from the second IDT, while a balanced terminal extends from each of the first and third IDTs, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of each of the IDTs is narrower than that of the other electrode finger portion of the IDT, and wherein denoting the middle point of the second IDT as a center, the distance of two adjacent electrode fingers is different between the opposite sides of the center, at least at one location.

In accordance with a tenth preferred embodiment of the present invention, a longitudinally connected resonator type surface acoustic wave filter includes first to third IDTs which are successively arranged on a piezoelectric substrate along the propagation direction of a surface acoustic wave, wherein the first and third IDTs have an opposite phase to that of the second IDT, and an unbalanced terminal extends from the second IDT, while a balanced terminal extends from each of the first and third IDTs, whereby this longitudinally connected resonator type surface acoustic wave filter has a balanced-unbalanced conversion function; wherein each of the IDTs has a narrow-pitch electrode finger portion in which the pitch of one electrode finger portion from the adjacent IDT-side end of each of the IDTs is narrower than that of the other electrode finger portion of the IDT, and wherein the distance between the central axes of the two adjacent electrode fingers between adjacent IDTs, and/or the distance between central axes of the two adjacent electrode fingers between the narrow-pitch electrode finger portion and the electrode finger portion other than the narrow-pitch electrode finger portion, are different between the opposite sides of the second IDT.

In accordance with an eleventh preferred embodiment of the present invention, a longitudinally connected resonator type surface acoustic wave filter includes first to third IDTs which are successively arranged on a piezoelectric substrate along the propagation direction of a surface acoustic wave, wherein the first and third IDTs have an opposite phase to that of the second IDT, and an unbalanced terminal extends from the second IDT, while a balanced terminal extends from each of the first and third IDTs, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of each of the IDTs is narrower than that of the other electrode finger portion of the IDT, and wherein the longitudinally connected resonator type surface acoustic wave filter further including at least two of the following features (a) to (d):

(a) the duty of the electrode fingers in the narrow-pitch electrode finger portion is different between the portion where the first and second IDTs are adjacent to each other, and the portion where the second and third IDTs are adjacent to each other;

(b) the pitch of the electrode fingers in the narrow-pitch electrode finger portion is different between the portion where the first and second IDTs are adjacent to each other, and the portion where the second and third IDTs are adjacent to each other;

(c) denoting the middle point of the second IDT be a center, the distance of two adjacent electrode fingers is different between the opposite sides of the above-described center, at least at one location; and (d) at least one of the distance between central axes of the two adjacent electrode fingers between adjacent IDTs, and the distance between the central axes of the two adjacent electrode fingers between the narrow-pitch electrode finger portion and the electrode finger portion other than the narrow-pitch electrode finger portion, is different between the opposite sides of the second IDT.

In accordance with a twelfth preferred embodiment of the present invention, a longitudinally connected resonator type surface acoustic wave filter includes first to third IDTs which are successively arranged on a piezoelectric substrate along the propagation direction of a surface acoustic wave, wherein the first and third IDTs have an opposite phase to that of the second IDT, and an unbalanced terminal extends from the second IDT, while a balanced terminal extends from each of the first and third IDTs, whereby this longitudinally connected resonator type surface acoustic wave filter has a balanced-unbalanced conversion function, wherein each of the IDTs has a chirp type electrode finger portion in which the pitch of one electrode finger portion from the adjacent IDT-side end of each of the IDTs is linearly changed along the propagation direction of a surface acoustic wave, and wherein the configuration of the chirp type electrode finger portion is different between the portion where the first and second IDTs are adjacent to each other, and the portion where the second and third IDTs are adjacent to each other.

In accordance with a thirteenth preferred embodiment of the present invention, a longitudinally connected resonator type surface acoustic wave filter includes first to third IDTs which are successively arranged on a piezoelectric substrate along the propagation direction of a surface acoustic wave, wherein the second IDT is divided into two portions, the first and third IDTs have an opposite phase to that of the second IDT, and an unbalanced terminal extends from each of the first and third IDTs, while a pair of balanced terminals extend from the second IDT which has been divided into two portions, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of each of the IDTs is narrower than that of the other electrode finger portion of the IDT, and wherein the duty of the electrode fingers in the narrow-pitch electrode finger portion is different between the portion where the first and second IDTs are adjacent to each other, and the portion where the second and third IDTs are adjacent to each other.

In accordance with a fourteenth preferred embodiment of the present invention, a longitudinally connected resonator type surface acoustic wave filter includes first to third IDTs which are successively arranged on a piezoelectric substrate along the propagation direction of a surface acoustic wave, wherein the second IDT is divided into two portions, the first and third IDTs have an opposite phase to that of the second IDT, and an unbalanced terminal extends from each of the first and third IDTs, while a pair of balanced terminals extend from the second IDT which has been divided into two portions, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of each of the IDTs is narrower than that of the other electrode finger portion of the IDT, and wherein the pitch of the electrode fingers in the narrow-pitch electrode finger portion is different between the portion where the first and second IDTs are adjacent to each other, and the portion where the second and third IDTs are adjacent to each other.

In accordance with a fifteenth preferred embodiment of the present invention, a longitudinally connected resonator type surface acoustic wave filter, includes first to third IDTs which are successively arranged on a piezoelectric substrate along the propagation direction of a surface acoustic wave, wherein the second IDT is divided into two portions, the first and third IDTs have an opposite phase to that of the second IDT, and an unbalanced terminal extends from each of the first and third IDTs, while a pair of balanced terminals extend from the second IDT which has been divided into two portions, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of each of the IDTs is narrower than that of the other electrode finger portion of the IDT, and wherein denoting the middle point of the second IDT be a center, the distance of two adjacent electrode fingers is different between the opposite sides of the above-described center, at least at one location.

In accordance with a sixteenth preferred embodiment of the present invention, a longitudinally connected resonator type surface acoustic wave filter includes first to third IDTs which are successively arranged on a piezoelectric substrate along the propagation direction of a surface acoustic wave, wherein the second IDT is divided into two portions, the first and third IDTs have an opposite phase to that of the second IDT, and an unbalanced terminal extends from each of the first and third IDTs, while a pair of balanced terminals extend from the second IDT which has been divided into two portions, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of each of the IDTs is narrower than that of the other electrode finger portion of the IDT, and wherein at least one of the distance between the central exes of the two adjacent electrode fingers between adjacent IDTs and the distance between the central axes of the two adjacent electrode fingers between the narrow-pitch electrode finger portion and the electrode finger portion other than the narrow-pitch electrode finger portion, is different between the opposite sides of the second IDT.

In accordance with a seventeenth preferred embodiment of the present invention, a longitudinally connected resonator type surface acoustic wave filter includes first to third IDTs which are successively arranged on a piezoelectric substrate along the propagation direction of a surface acoustic wave, wherein the second IDT is divided into two portions, the first and third IDTs have an opposite phase to that of the second IDT, and an unbalanced terminal extends from each of the first and third IDTs, while a pair of balanced terminals extend from the second IDT which has been divided into two portions, whereby this longitudinally connected resonator type surface acoustic wave filter has a balanced-unbalanced conversion function, wherein each of the IDTs has a narrow-pitch electrode finger portion in which the pitch of one electrode finger portion from the adjacent IDT-side end of the each IDT is narrower than that of the other electrode finger portion of the IDT, and wherein the longitudinally connected resonator type surface acoustic wave filter further includes at least two of the following features (a) to (d):

(a) the duty of the electrode fingers in the narrow-pitch electrode finger portion is different between the portion where the first and second IDTs are adjacent to each other, and the portion between the second and third IDTs are adjacent to each other;

(b) the pitch of the electrode fingers in the narrow-pitch electrode finger portion is different between the portion where the first and second IDTs are adjacent to each other, and the portion where the second and third IDTs are adjacent to each other;

(c) denoting the middle point of the second IDT be a center, the distance of two adjacent two electrode fingers is different between the opposite sides of the above-described center, at least at one location;

(d) at least one of the distance between the central axes of the two adjacent electrode fingers between adjacent IDTs and the distance between the central axes of the two adjacent electrode fingers between the narrow-pitch electrode finger portion and the electrode finger portion other than the narrow-pitch electrode finger portion, is different between the opposite sides of the second IDT.

In accordance with an eighteenth preferred embodiment of the present invention, a longitudinally connected resonator type surface acoustic wave filter includes first to third IDTs which are successively arranged on a piezoelectric substrate along the propagation direction of a surface acoustic wave, wherein the second IDT is divided into two portions, the first and third IDTs have an opposite phase to that of the second IDT, and an unbalanced terminal extends from each of the first and third IDTs, while a pair of balanced terminals extend from the second IDT which has been divided into two portions, whereby this longitudinally connected resonator type surface acoustic wave filter has a balanced-unbalanced conversion function; and wherein each of the IDTs has a chirp type electrode finger portion in which the pitch of one electrode finger portion from the adjacent IDT-side end of each of the IDTs is linearly changed along the propagation direction of a surface acoustic wave; and wherein the configuration of the chirp type electrode finger portion is different between the portion where the first and second IDTs are adjacent to each other, and the portion where the second and third IDTs are adjacent to each other.

Furthermore, another preferred embodiment of the present invention provides a communication device including a longitudinally connected resonator type surface acoustic wave filter in accordance with any one of the preferred embodiments described above.

Other features, elements, characteristics and advantages of the present invention will become more apparent from the following detailed description of preferred embodiments of the present invention with reference to the attached drawings.

BRIEF DESCRIPTION OF THE DRAWINGS

FIGS. 1A to 1C are views showing the electrode structure of a longitudinally connected resonator type surface acoustic wave filter in accordance with a first preferred embodiment of the present invention, wherein FIG. 1A is a schematic plan view, and FIGS. 1B and 1C are enlarged partially cutaway plan views of the main section of FIG. 1A.

FIG. 5 is a diagram showing the variation in the maximum amplitude balance degree when the duty of the narrow-pitch electrode finger portion of one of the longitudinally connected resonator type surface acoustic wave filters is varied in the first preferred embodiment of the present invention.

FIG. 6 is a diagram showing the variation in the maximum phase balance degree when the duty of the narrow-pitch electrode finger portion of one of the longitudinally connected resonator type surface acoustic wave filters is varied in the first preferred embodiment of the present invention.

DETAILED DESCRIPTION OF PREFERRED EMBODIMENTS

Figure 2:
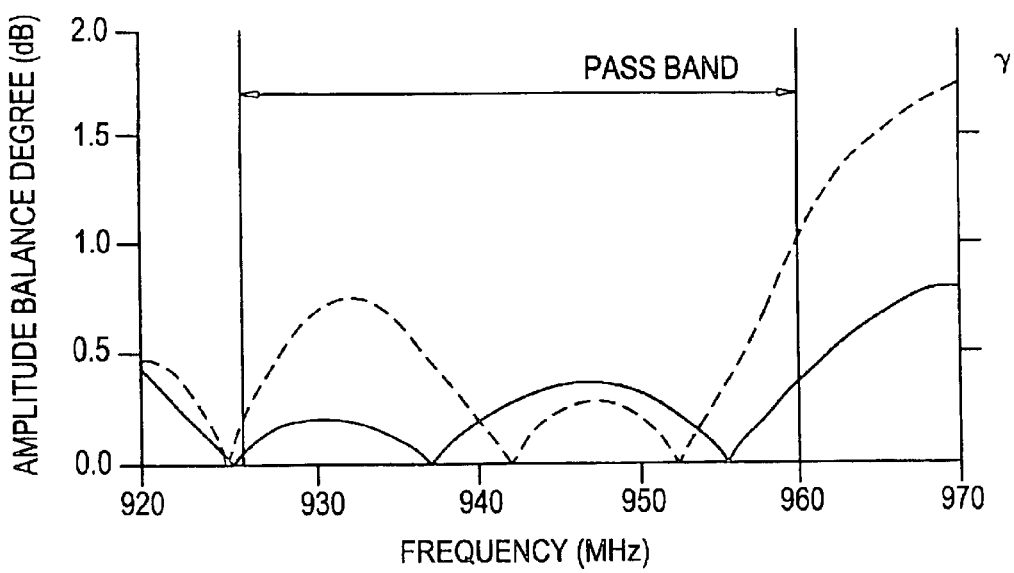
FIG. 2 is a diagram showing the amplitude balance degree-frequency characteristics relationship of the surface acoustic wave filter in accordance with the first preferred embodiment and a surface acoustic wave filter prepared for comparison to the first preferred embodiment of the present invention.

A first preferred embodiment in accordance with the present invention will be described with reference to FIGS. 1A to 1C.

This preferred embodiment is preferably adapted to be used as a receiving band-pass filter for use in an EGSM type portable telephone.

In this preferred embodiment, an electrode structure shown in FIG. 1A is provided on a 40±5°, Y-cut, X-propagation $LiTaO_3$ substrate 2. As illustrated in FIG. 1A, a longitudinally connected resonator type surface acoustic wave filter 4 is connected to an unbalanced signal terminal 3. To this longitudinally connected resonator type surface acoustic wave filter 4, first and second longitudinally connected resonator type surface acoustic wave filters 5 and 6 are connected. In other words, first terminals of these first and second longitudinally connected resonator type surface acoustic wave filters 5 and 6 are connected to an unbalanced signal terminal 3 via the longitudinally connected resonator type surface acoustic wave filter 4. Second terminals of these first and second longitudinally connected resonator type surface acoustic wave filters 5 and 6 are connected to balanced signal terminals 7 and 8, respectively.

The longitudinally connected resonator type surface acoustic wave filter 4 has first to third IDTs 4a to 4c arranged along the propagation direction of a surface acoustic wave, and reflectors 4d and 4e disposed on the opposite sides of the area where the IDTs 4a to 4c are arranged along the propagation direction of a surface acoustic wave. One end of the IDT 4b is connected to the unbalanced signal terminal 3. The other end of the IDT 4b and one-side ends of the IDTs 4a and 4c are each connected to the ground potential. The other ends of the IDTs 4a and 4c are connected to the longitudinally connected resonator type surface acoustic wave filters 5 and 6, respectively.

As in the case of the longitudinally connected resonator type surface acoustic wave filter 4, the longitudinally connected resonator type surface acoustic wave filters 5 and 6 have first to third IDTs 5a to 5c; and 6a to 6c, respectively, and reflectors 5d and 5e; and 6d and 6e, respectively. One side end of each of the first and third IDTs 5a and 5c of the longitudinally connected resonator type surface acoustic wave filter 5 are commonly connected to the IDT 4a of the longitudinally connected resonator type surface acoustic wave filter 4. The other side end of each of the IDTs 5a and 5c are connected to the ground potential. One end of the central second IDT 5b is connected to the balanced signal terminal 7, and the other end thereof is connected to the ground potential.

Likewise, one side end of each of the first and third IDTs 6a and 6c of the longitudinally connected resonator type surface acoustic wave filter 6 are commonly connected to one end of the IDT 4c of the longitudinally connected resonator type surface acoustic wave filter 4. The other end of each of the IDTs 6a and 6c are connected to the ground potential. One end of the central second IDT 6b is connected to the balanced signal terminal 8, and the other end thereof is connected to the ground potential.

In this preferred embodiment, in the longitudinally connected resonator type surface acoustic wave filters 4 to 6, at the portions where the central second IDTs 4b, 5b and 6b are adjacent to the IDTs on the opposite sides thereof, that is, the first and third IDTs 4a and 4c; 5a and 5c; and 6a and 6c, the IDTs on the opposite sides thereof are provided with narrow-pitch electrode finger portions each of which has a smaller electrode finger pitch than the pitch in the remaining electrode pitch portion.

FIG. 1B shows an enlarged view of the portion where the IDT 4a and IDT 4b are adjacent to each other. A plurality of electrode fingers at one portion from the IDT 4b-side end of the IDT 4a is configured such that the electrode finger pitch thereof is narrower than that of the other portion of this IDT 4a. That is, a narrow-pitch electrode finger portion $4a_1$ is provided. Likewise, a plurality of electrode fingers at one portion from the IDT 4a-side end of the IDT 4b is configured such that the electrode finger pitch thereof is narrower than that of the other portion of this IDT 4b, thereby forming a narrow-pitch electrode finger portion $4b_1$. In this manner, in this preferred embodiment, at the portions where IDTs are adjacent to each other, narrow-pitch electrode fingers are provided in the IDTs on both sides. Specifically, at the portions where the IDTs 4b and 4c are adjacent to each other, $4b_2$ and $4c_1$ are provided, as well. Likewise, narrow-pitch electrode finger portions $5a_1$ and $5b_1$; $5b_2$ and $5c_1$; $6a_1$ and $6b_1$; and $6b_2$ and $6c_1$ are each provided (FIGS. 1A and 1B).

Meanwhile, FIGS. 1A to 1C illustrate a lower number of electrode fingers than the actual surface acoustic wave filter includes to simplify the figures.

Next, detailed features of the longitudinally connected resonator type surface acoustic wave filter 1 in accordance with this preferred embodiment will be described. Denoting the wavelength of the surface acoustic wave determined by the electrode finger pitch in the above-described narrow-pitch electrode finger portion as λI2, and the wavelength of the surface acoustic wave determined by the electrode finger pitch in the other electrode finger portion as λI1.

crossing width W of electrode fingers=35.8λI1 number of electrode fingers of first IDT 4a: the number of electrode fingers in the narrow-pitch electrode finger portion is 4, and that in the remaining portion is 25.

number of electrode fingers of central second IDT 4b: narrow-pitch electrode finger portions, each constituted of 4 electrode fingers, are formed on both sides of the IDT, and 27 electrode fingers are disposed between both sides.

number of electrode fingers of third IDT 4c: the number of electrode fingers in the narrow-pitch electrode finger portion is 4, and that in the remaining portion is 25.

λI1=4.19 μm

λI2=3.90 μm wavelength of reflector, λR=4.29 μm number of electrode fingers in reflector=100 distance of the portion sandwiched between an electrode finger with wavelength λI1 and an electrode finger with wavelength λI2: this is, the electrode finger intercentral distance at the portion where a narrow-pitch electrode finger portion and the other electrode finger portion are adjacent to each other. Taking the IDT 6a of the longitudinally connected resonator type surface acoustic wave filter 6 as an example, as shown in FIG. 1C, A is the electrode finger intercentral distance at the portion where the narrow-pitch electrode finger portion $6a_1$ and the other electrode finger portion are adjacent to each other. Such an electrode finger intercentral distance at the portion where a narrow-pitch electrode finger portion and the other electrode finger portion are mutually adjacent, is set to (0.25λI1+0.25λI2).

distance between two adjacent IDTs, i.e., the electrode finger intercentral distance of two narrow-pitch electrode finger portions at the portion where two IDT are mutually adjacent=0.50λI2.

IDT—reflector distance=0.50λR (the intercentral distance between the electrode fingers at the end of an IDT and that at the end of a reflector)

duty of IDT=0.73 duty of reflector=0.55

Here, "duty" refers to the ratio of the dimension of electrode fingers along the propagation direction of a surface acoustic wave, that is, width dimension thereof with respect to the sum of the width dimension thereof and the widthwise dimension of the space among electrode fingers.

film-thickness of electrode=$0.08\lambda I1$

Each of the longitudinally connected resonator type surface acoustic wave filters 5 and 6 is provided with an electrode film-thickness substantially equal to that of the longitudinally connected resonator type surface acoustic wave filter 4. In the longitudinally connected resonator type surface acoustic wave filters 5 and 6, however, the crossing width W of electrode finger is set to be one half of that of the longitudinally connected resonator type surface acoustic wave filter 4, that is, $17.9\lambda I1$. The difference between the longitudinally connected resonator type surface acoustic wave filters 5 and 6 is that the central second IDT 6b of the longitudinally connected resonator type surface acoustic wave filter 6 has an opposite phase to the central second IDT 5b of the longitudinally connected resonator type surface acoustic wave filter 5, and that the duty of the narrow-pitch electrode finger portion of the longitudinally connected resonator type surface acoustic wave filter 5 is set to 0.73 in the same manner as the other IDT portion, whereas the duty of the longitudinally connected resonator type surface acoustic wave filter 6 is set to 0.58.

Figure 3:
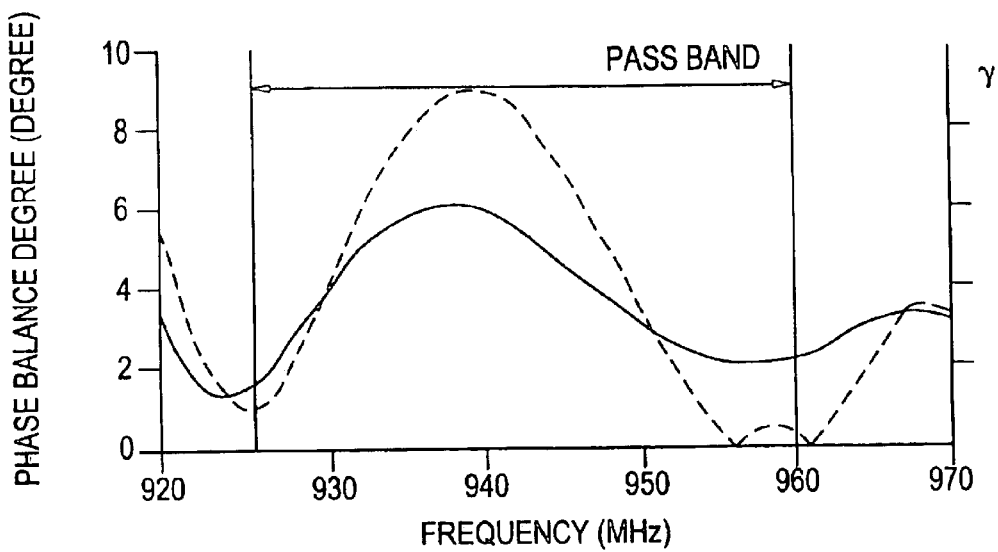
FIG. 3 is a diagram showing the phase balance degree-frequency characteristics relationship of the surface acoustic wave filter in accordance with the first preferred embodiment and a surface acoustic wave filter prepared for comparison to the first preferred embodiment of the present invention.

In FIGS. 2 and 3, the amplitude balance degree and the phase balance degree with respect to the frequency characteristics of the longitudinally connected resonator type surface acoustic wave filter 1, are illustrated, respectively, using a solid line. Also, the amplitude balance degree and the phase balance degree with respect to the frequency characteristics of a surface acoustic wave filter prepared for comparison, are illustrated in FIGS. 2 and 3, respectively, using a broken line.

Here, the surface acoustic wave filter prepared for comparison has a similar configuration to the above-described preferred embodiment, except that the duty of the narrow-pitch electrode finger portion in the longitudinally connected resonator type surface acoustic wave filter 6 is set to 0.73 in the same manner as the longitudinally connected resonator type surface acoustic wave filter 5.

The frequency range of the pass band in an EGSM type receiving filter is 925 to 960 MHz. Within this frequency range, the maximum amplitude balance degree is 0.4 dB for this preferred embodiment, in contrast to 1.0 dB for the comparative example. This shows that this preferred embodiment improves the amplitude balance degree by 0.6 dB over the comparative example. Likewise, the phase balance degree is a maximum of 6° for this preferred embodiment, in contrast to a maximum of 9° for the comparative example. That is, this preferred embodiment improves the phase balance degree by 3 dB over the comparative example.

The reason why this embodiment improves the amplitude balance degree and the phase balance degree as described above, will be discussed. As described in "Description of the Related Art", the reason that the balance degrees deteriorate in this kind of surface acoustic wave device is because, among the electrode fingers of the central IDT 5b of the longitudinally connected resonator type surface acoustic wave filter 5, the electrode fingers adjacent to the IDTs 5a and 5c on the opposite sides thereof define a ground electrode, whereas, among the electrode fingers of the central IDT 6b of the longitudinally connected resonator type surface acoustic wave filter 6 connected in parallel with the longitudinally connected resonator type surface acoustic wave filter 5, the electrode fingers adjacent to the IDTs 6a and 6c on the opposite sides thereof define a signal electrode. Thereby, an imbalance occurs between the frequency characteristics of the longitudinally connected resonator type surface acoustic wave filter 5 and those of the longitudinally connected resonator type surface acoustic wave filter 6, resulting in deteriorated balance degrees.

In this preferred embodiment, to compensate for the above-described imbalance in the frequency characteristics, the duty of the above-described narrow-pitch electrode finger portion in the second longitudinally connected resonator type surface acoustic wave filter 6 is different from the duty of the narrow-pitch electrode finger portion in the first longitudinally connected resonator type surface acoustic wave filter 5.

Figure 4:
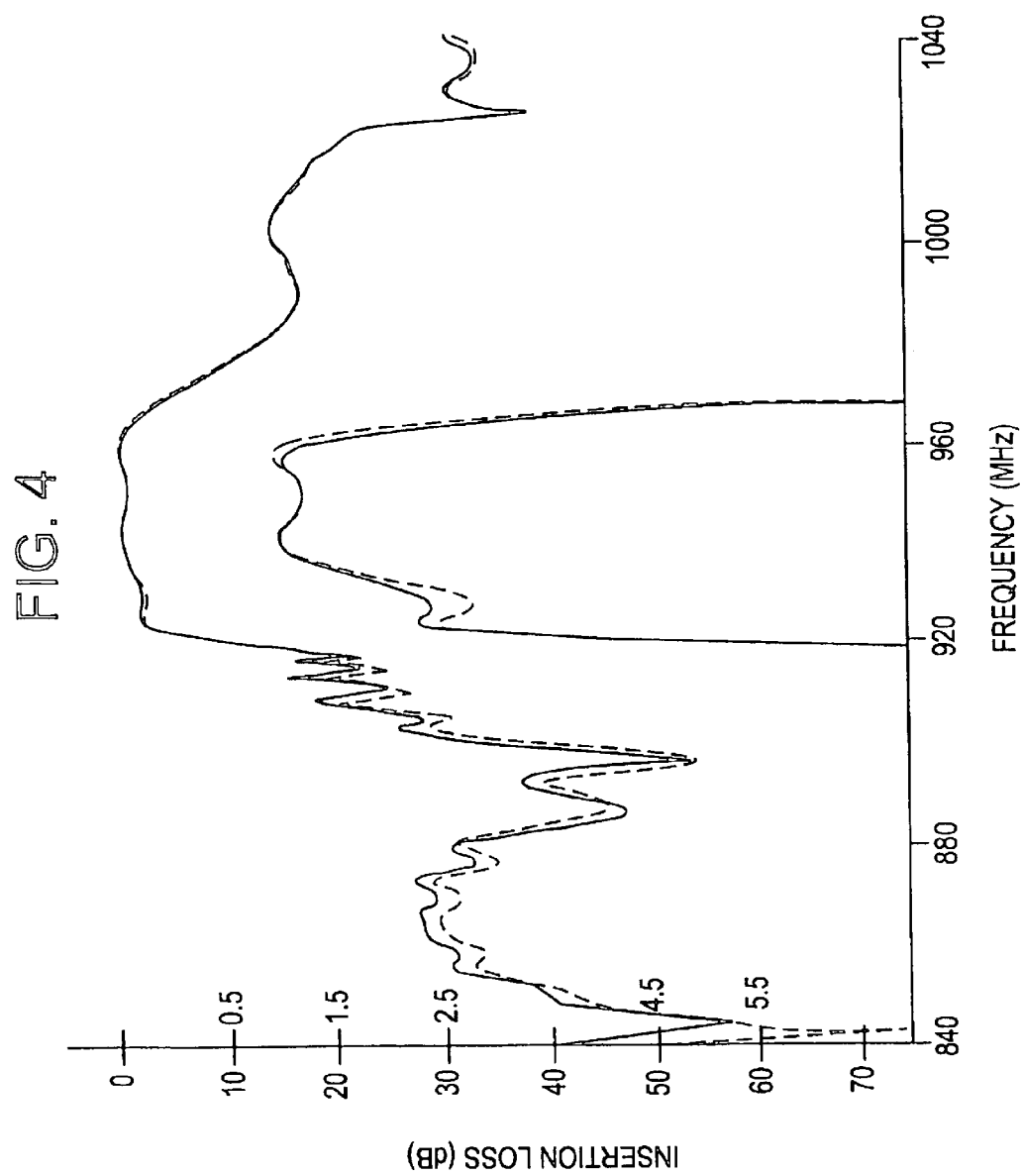
FIG. 4 is a diagram showing the frequency characteristics of the first and second longitudinally connected resonator type surface acoustic wave filters used in the first preferred embodiment of the present invention.

In FIG. 4, the frequency characteristics of the longitudinally connected resonator type surface acoustic wave filters 5 and 6 in this preferred embodiment are shown using solid lines and broken lines, respectively. In each of the filters, an impedance matching has been achieved with 100 Ω. In the figure, the right side scale of the vertical axis shows enlarged frequency characteristics.

Figure 25:
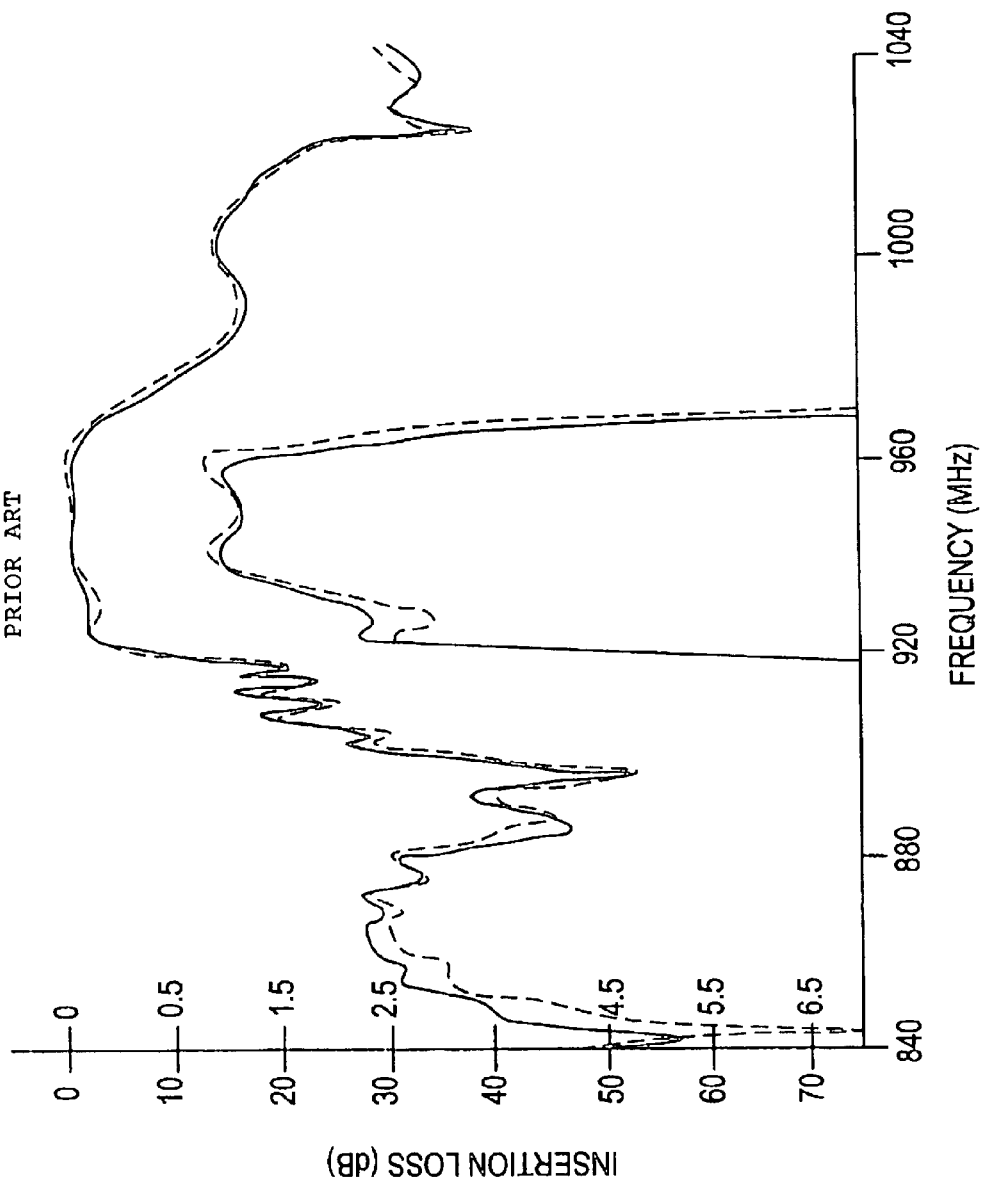
FIG. 25 is a diagram for explaining the difference in the frequency characteristics between the first and second longitudinally connected resonator type surface acoustic wave filters used in the longitudinally connected resonator type surface acoustic wave filter shown in FIG. 22.

As shown in FIG. 4, in this preferred embodiment, the difference in the frequency characteristics between the longitudinally connected resonator type surface acoustic wave filters 5 and 6 is smaller than the above-described case shown in FIG. 25.

FIGS. 5 and 6 shows the variations in the maximum amplitude balance degree and the maximum phase balance degree within the above-mentioned pass band when the duty of the narrow-pitch electrode finger portion of the longitudinally connected resonator type surface acoustic wave filter 6 is varied. Here, the value on the horizontal axis indicates a duty value normalized by the duty 0.73 which is a value before the duty is varied. The amplitude balance degree exhibits a value of 1.0 dB or less in the range of about 0.48 or more to less than 0.73 of the duty of the narrow-pitch electrode finger portion. That is, the amplitude balance degree is improved over the situation where the duty of the narrow-pitch electrode finger portion of this filter is set to be the same as that of the longitudinally connected resonator type surface acoustic wave filter 5. On the other hand, the phase balance degree exhibits a minimum value at about 0.53 of the duty of the narrow-pitch electrode finger, and the phase balance degree exhibits values 10° or less, up to about 0.46 of the duty.

In this preferred embodiment, among the electrode fingers of the central IDT 6b, the electrode fingers adjacent to the IDTs 6a and 6c disposed on the left and right sides thereof define a signal electrode, and the electrode fingers adjacent to the central IDT 6b of the IDTs 6a and 6c define a ground electrode.

When a signal electrode and a ground electrode are adjacent to each other at the portion where IDTs are mutually adjacent, the conversion efficiency into a resonant mode current which has an intense peak at an IDT-IDT distance portion increases, and the insertion loss in a pass band decreases particularly at the higher frequency side thereof, and as shown in FIG. 4, the pass band is wider, than in the case where two ground electrodes or two signal electrodes are adjacent to each other. That is, in this case, by reducing the duty of the narrow-pitch electrode finger portion, the characteristics of the surface acoustic wave filter 6 are made the same as the surface acoustic wave filter 5. Conversely, even with the surface acoustic wave filter 5 wherein, among the electrode fingers of the central IDT 5b of the surface acoustic wave filter 5, the electrode fingers adjacent to the IDTs 5a and 5c disposed on left and right sides thereof, and the electrode fingers adjacent of the central IDT 5b of the IDTs 5a and 5c both define ground electrodes or both define signal electrodes, the balance degrees is greatly improved by varying the duty of the narrow-pitch electrode finger portion of the surface acoustic wave filter 5. This situation is, however, different from that of the above-described preferred embodiment.

Specifically, in the structure shown in FIG. 1, when attempting to improve the balance degrees of the surface acoustic wave filter 5 wherein the electrode fingers of IDT 5b adjacent to the IDTs 5a and 5c define a ground electrode, by varying the duty of the narrow-pitch electrode finger portion thereof, it is necessary to increase the duty in contrast to the above-described preferred embodiment. Even by this method, the balance degrees is improved. However, the increased duty makes etching of the electrode fingers more difficult.

Therefore, as in this preferred embodiment, it is desirable to improve the balance degrees by reducing the duty of the narrow-pitch electrode finger portion, on the side of the surface acoustic wave filter 6 having a ground electrode and a signal electrode adjacent to each other at an IDT-IDT distance portion.

Figure 7:
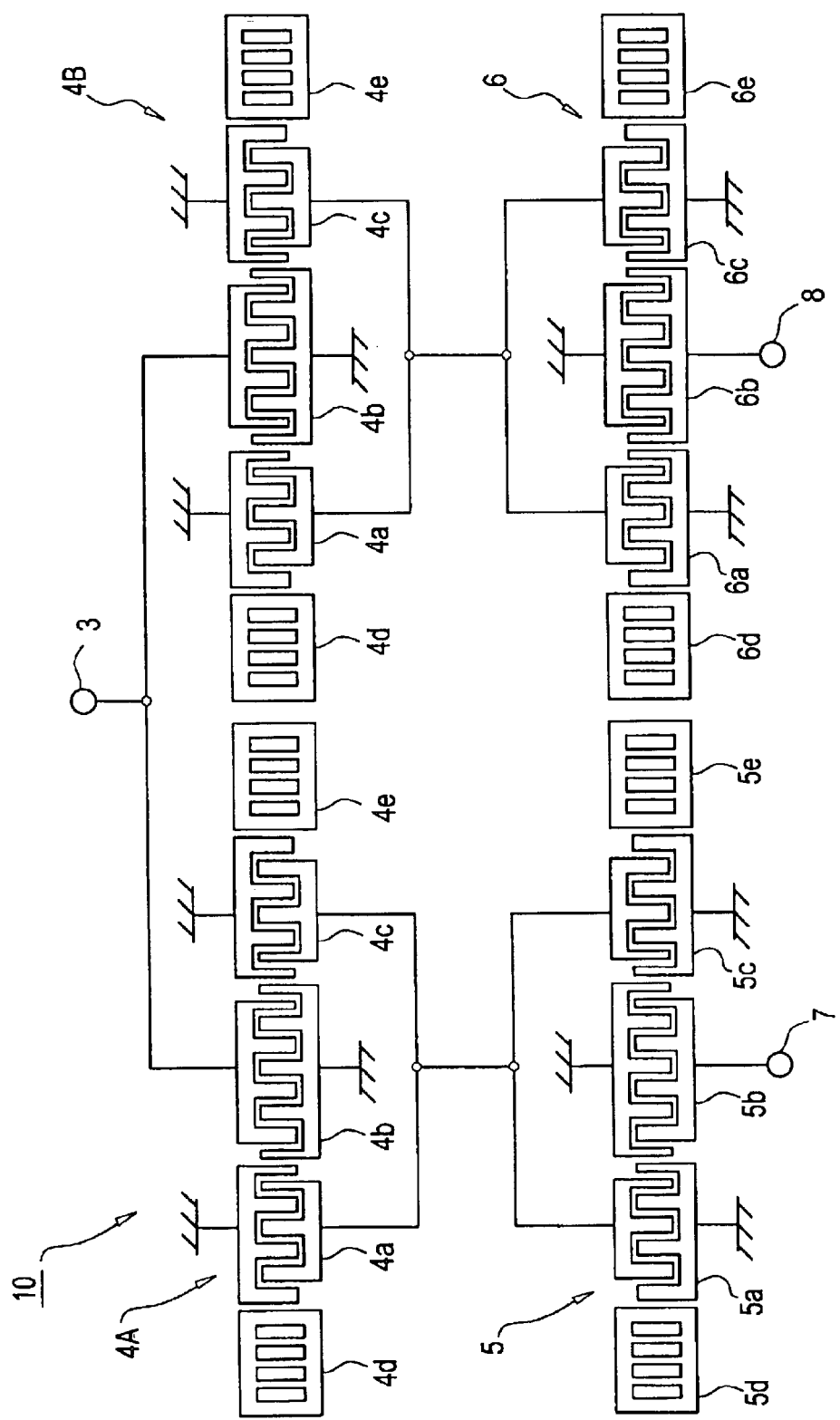
FIG. 7 is a schematic plan view showing the electrode structure of a longitudinally connected resonator type surface acoustic wave filter in accordance with a modification of the first preferred embodiment of the present invention.

FIG. 7 is a schematic plan view showing the electrode structure of a longitudinally connected resonator type surface acoustic wave filter in accordance with a modification of the first preferred embodiment.

In the longitudinally connected resonator type surface acoustic wave filter 10 shown in FIG. 7, two longitudinally connected resonator type surface acoustic wave filters 4A and 4B are connected with each other on an unbalanced signal terminal 3 side. The crossing width of electrode fingers of each of the longitudinally connected resonator type surface acoustic wave filters 4A and 4B is one half of that of the longitudinally connected resonator type surface acoustic wave filters 4 in accordance with the above-described preferred embodiment. In other words, the longitudinally connected resonator type surface acoustic wave filter 10 in accordance with this preferred embodiment corresponds to the structure provided by dividing the longitudinally connected resonator type surface acoustic wave filter 4 into the longitudinally connected resonator type surface acoustic wave filters 4a and 4B. As in the above-described preferred embodiment, in this preferred embodiment, the balance degrees are greatly improved by varying the duty of the narrow-pitch electrode finger portion, in between the first and second longitudinally connected resonator type surface acoustic wave filters 5 and 6.

In the first preferred embodiment, the description has been made of the longitudinally connected resonator type surface acoustic wave filter having the electrode structure shown in FIG. 1. However, even in the longitudinally connected resonator type surface acoustic wave filters 200 and 300 (see FIG. 23 and 24), each having three IDTs as described in "Description of the Related Art", the balance degrees can be improved in the same manner with this preferred embodiment. For example, in FIG. 24, at the portion where the IDT 300a and the IDT 300b are adjacent to each other, a signal electrode and a ground electrode are adjacent to each other, and at the portion where the IDT 300b and an IDT 300c are adjacent to each other, two ground electrodes are adjacent to each other. The same structure is present the surface acoustic wave filter 300 shown in FIG. 24.

Therefore, as in the case shown in FIG. 25, a difference occurs in the frequency characteristics between signals output from a pair of balanced signal terminals. In the structure shown in FIG. 24, this characteristics difference can be reduced by making the duty of the narrow-pitch electrode finger portion different between the portion where the IDT 200a and the IDT 200b are adjacent to each other, and the portion where the IDT 200b and an IDT 200c are adjacent to each other. Likewise, in the structure shown in FIG. 23, the duty of the narrow-pitch electrode finger portion should be different between the portion where the IDT 300a and the IDT 300b are adjacent to each other, and the portion where the IDT 300b and the IDT 300c are adjacent to each other, to compensate for the above-described characteristics difference.

Figure 8:
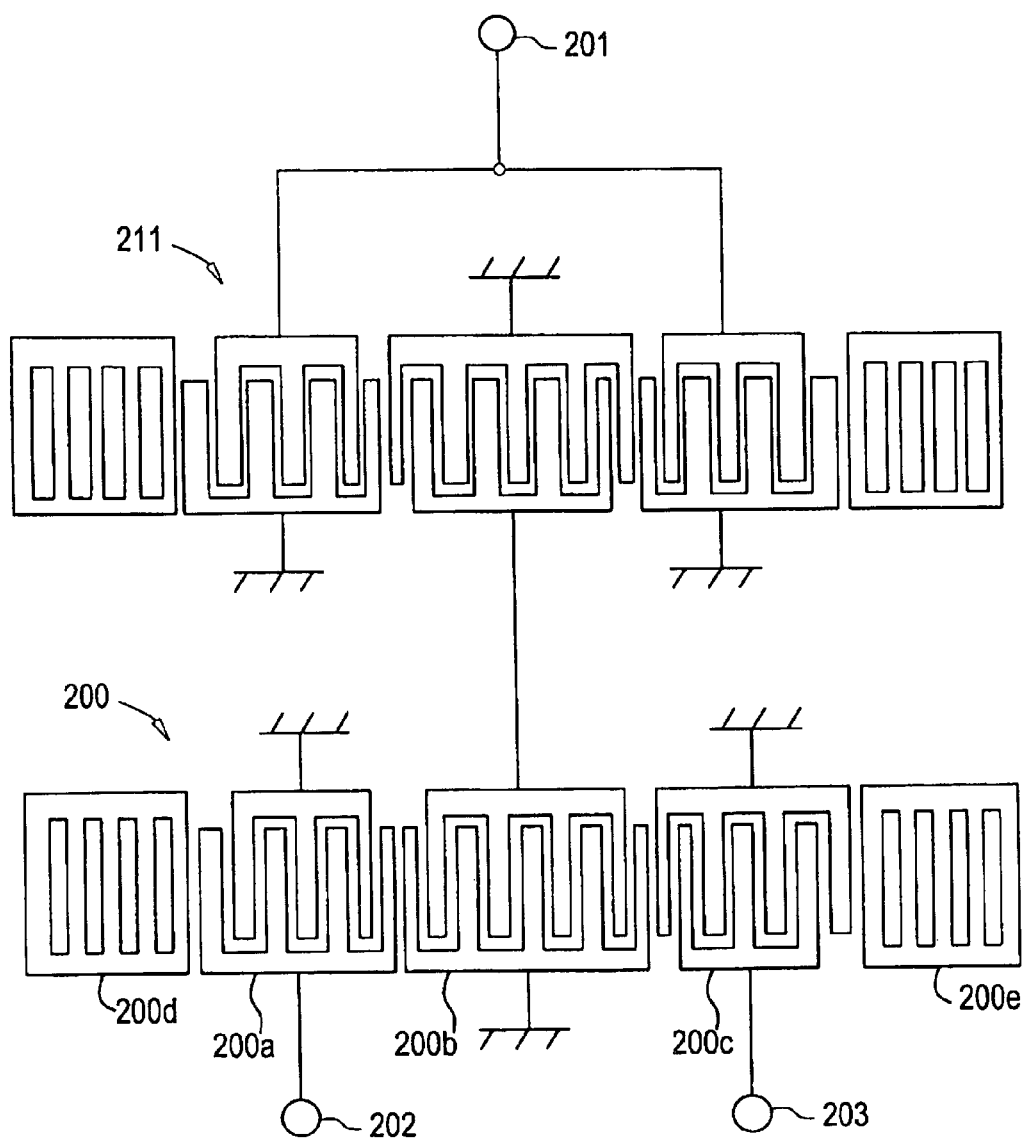
FIG. 8 is a schematic plan view for explaining another modification of a longitudinally connected resonator type surface acoustic wave filter in accordance with the first preferred embodiment of the present invention.
Figure 9:
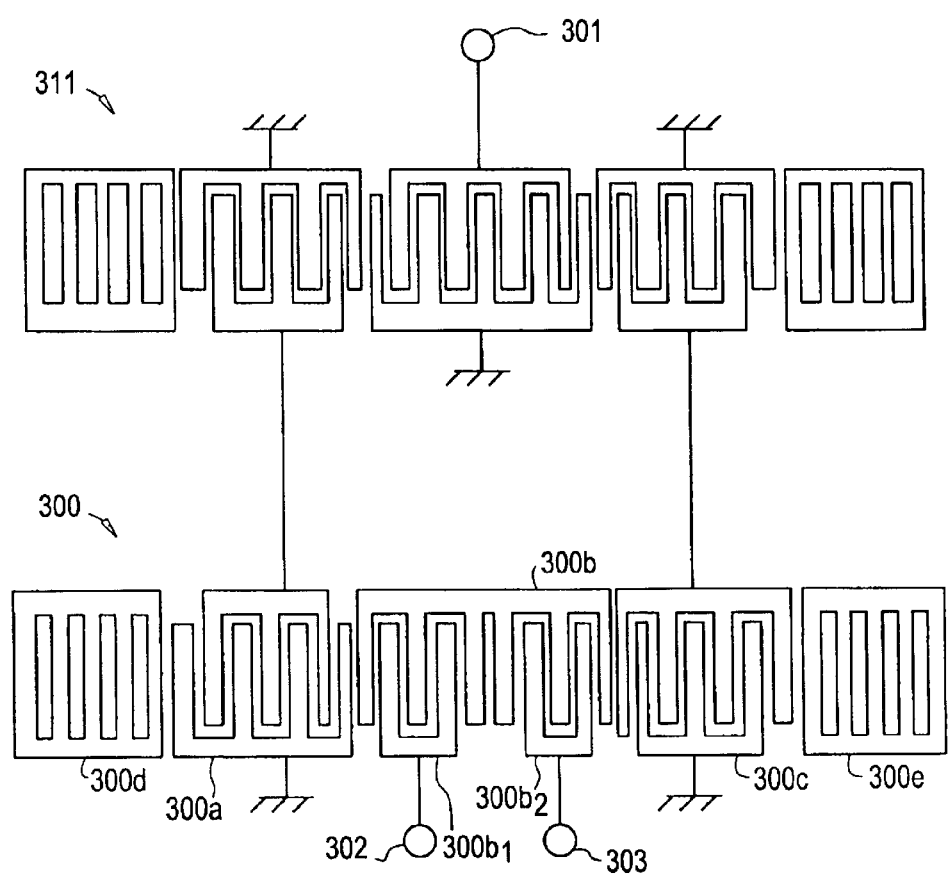
FIG. 9 is a schematic plan view for explaining still another modification of a longitudinally connected resonator type surface acoustic wave filter in accordance with the first preferred embodiment of the present invention.
Figure 10:
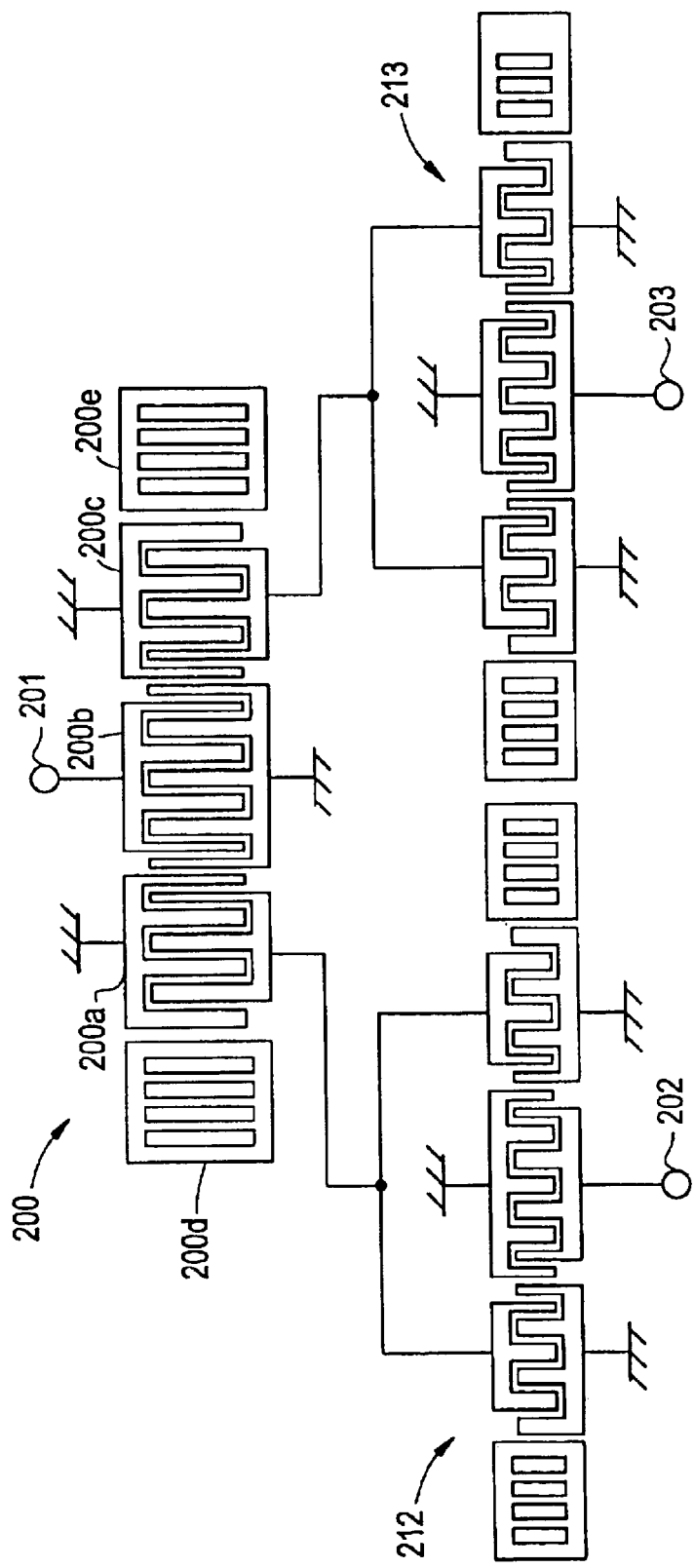
FIG. 10 is a schematic plan view for explaining a further modification of a longitudinally connected resonator type surface acoustic wave filter in accordance with the first preferred embodiment of the present invention.
Figure 23:
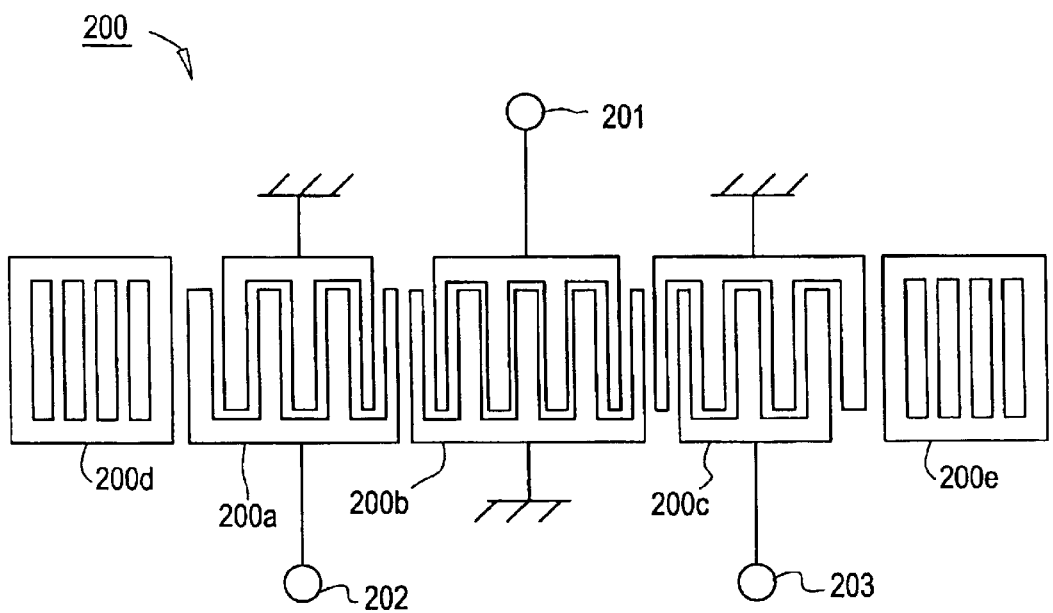
FIG. 23 is a schematic plan view for explaining another example of a conventional longitudinally connected resonator type surface acoustic wave filter.
Figure 24:
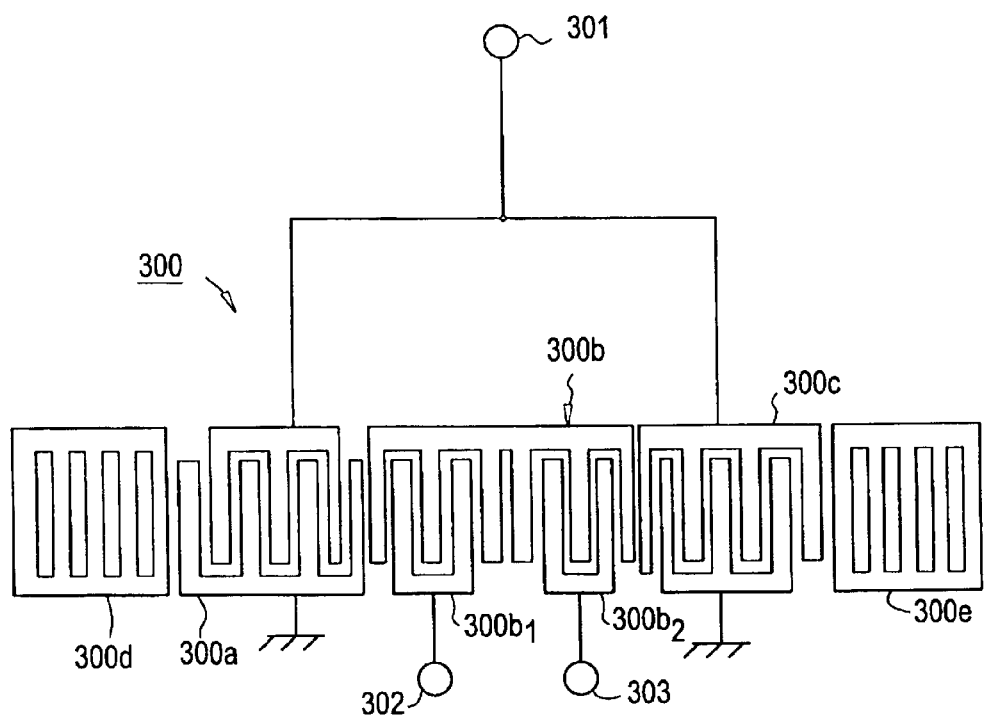
FIG. 24 is a schematic plan view for explaining still another example of a conventional longitudinally connected resonator type surface acoustic wave filter.

As shown in FIGS. 8 to 10, by additionally connecting longitudinally connected resonator type surface acoustic wave filters 211 or 311, or 212 and 213 in series with the configuration shown in FIG. 23 or 24, a multi-stage connection configuration is produced.

Figure 11:
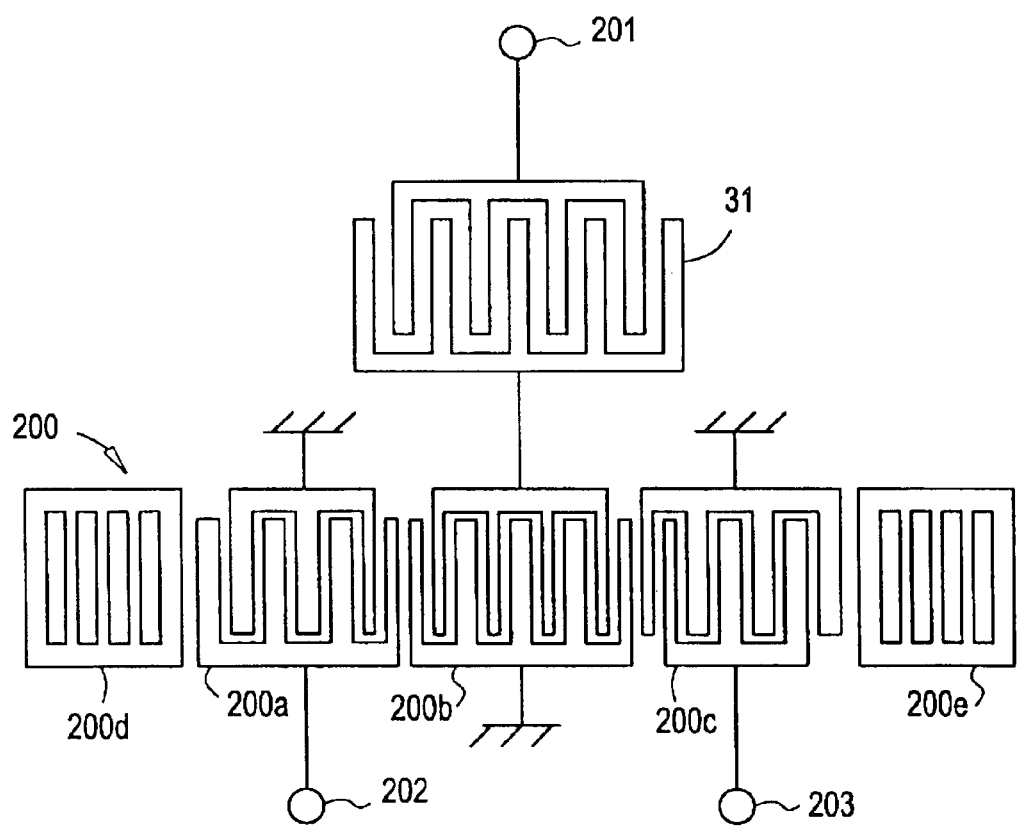
FIG. 11 is a schematic plan view for explaining a yet further modification of a longitudinally connected resonator type surface acoustic wave filter in accordance with the first preferred embodiment of the present invention.

Also, as shown in FIG. 11, a surface acoustic wave filter 31 may be connected to a longitudinally connected resonator type surface acoustic wave filter in series, or in parallel. In this manner, the present invention is applied to a device having at least one surface acoustic wave filter connected in series, or in parallel.

In this preferred embodiment, when the surface acoustic wave filter, including each IDT being configured to have a narrow-pitch electrode finger portion at the adjacent IDT-side end of the IDT, is provided with an unbalanced-balanced conversion function, the amplitude balance degree and the phase balance degree between balanced signal terminals are greatly improved by setting the duties of narrow-pitch electrode finger portions between two longitudinally connected resonator type surface acoustic wave filters to be different. On the other hand, with regard to the structure which performs an unbalanced-balanced conversion function using a single longitudinally connected resonator type surface acoustic wave filter, the amplitude balance degree and the phase balance degree between balanced signal terminals is improved by making the duties of narrow-pitch electrode finger portions between the opposite sides of the central IDT of the single longitudinally connected resonator type surface acoustic wave filter different.

In this preferred embodiment, a 40±5° Y-cut, X-propagation, LiTaO$_3$ substrate is used, but the substrate is not limited to this piezoelectric substrate, as will be easily understood in the light of the principle that the balance degrees are greatly improved as described above. A substrate formed of 64 to 72° Y-cut, X-propagation, LiNBO$_3$, or 41° Y-cut, X-propagation, LiNBO$_3$, or other suitable substrate, may be employed.

Next, the longitudinally connected resonator type surface acoustic wave filter in accordance with a second preferred embodiment will be described. The electrode structure of the second preferred embodiment is fundamentally the same as that of the first preferred embodiment shown in FIG. 1. The difference between the first and second preferred embodiments is that, in the first preferred embodiment, the duty of the narrow-pitch electrode finger portion of the second longitudinally connected resonator type surface acoustic wave filter 6 is different from that of the narrow-pitch electrode finger portion of the first longitudinally connected resonator type surface acoustic wave filter 5, whereas, in the second preferred embodiment, the electrode finger pitch of the narrow-pitch electrode finger portion of the second longitudinally connected resonator type surface acoustic wave filter 6 is different from that of the narrow-pitch electrode finger portion of the first longitudinally connected resonator type surface acoustic wave filter 5, to compensate for the above-described difference in the frequency characteristics between the first and second longitudinally connected resonator type surface acoustic wave filters 5 and 6.

Figure 12:
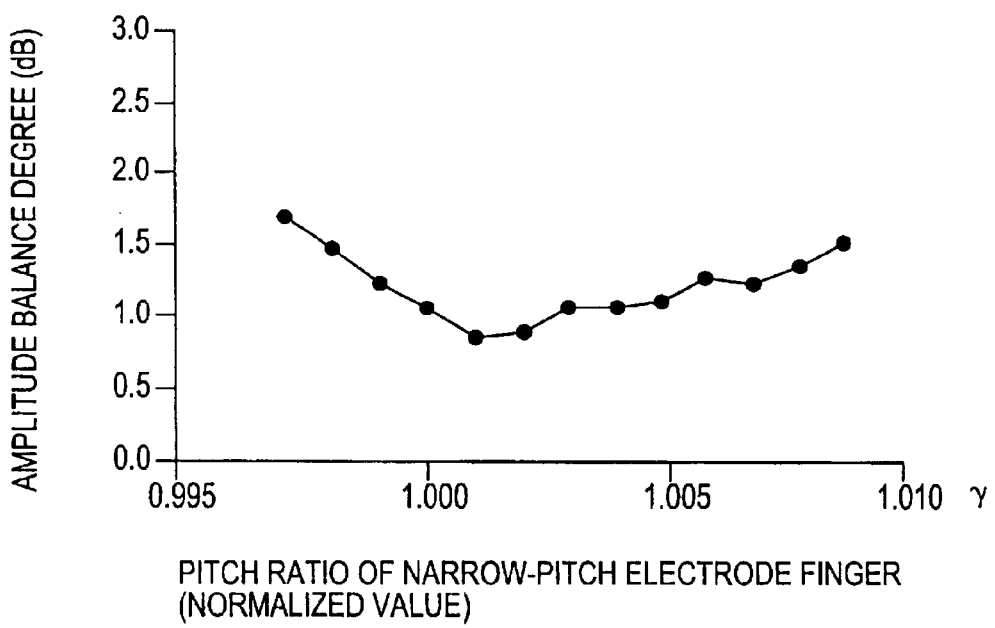
FIG. 12 is a diagram showing the variation in the maximum amplitude balance degree when the electrode finger pitch of the narrow-pitch electrode finger portion of one of the longitudinally connected resonator type surface acoustic wave filters is varied in a second preferred embodiment of the present invention.
Figure 13:
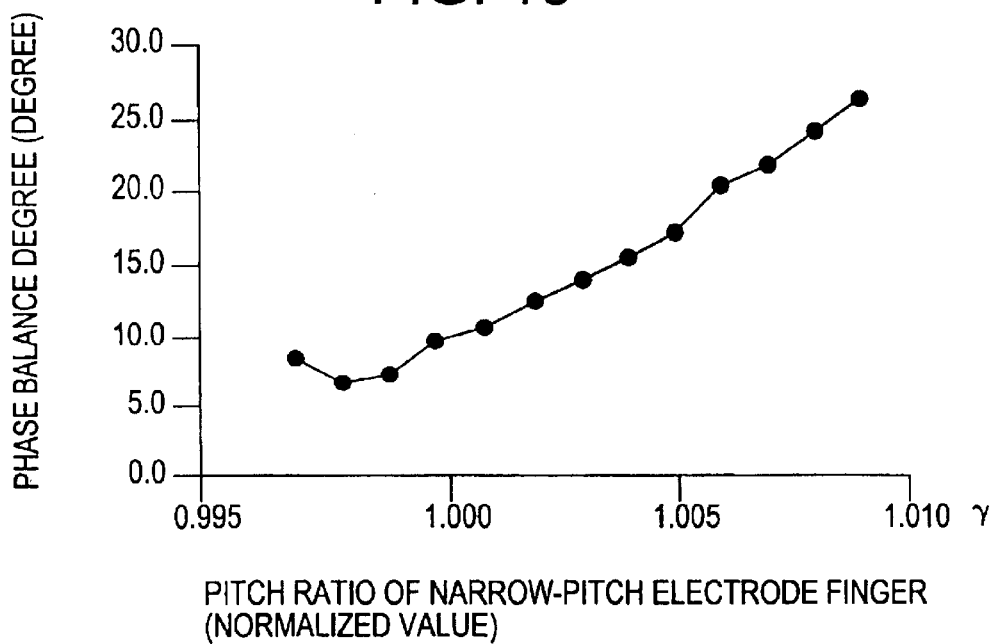
FIG. 13 is a diagram showing the variation in the maximum phase balance degree when the electrode finger pitch of the narrow-pitch electrode finger portion of one of the longitudinally connected resonator type surface acoustic wave filters is varied in the second preferred embodiment of the present invention.

FIGS. 12 and 13 show the variation in the maximum amplitude balance degree and the maximum phase balance degree, respectively, within the frequency range of an EGSM type receiving filter when the electrode finger pitch of the narrow-pitch electrode finger portion of the second longitudinally connected resonator type surface acoustic wave filter 6 is varied.

In FIGS. 12 and 13, each of the values on the horizontal axis is a value obtained by normalizing the ratio of the electrode finger pitch of the narrow-pitch electrode finger portion of the second longitudinally connected resonator type surface acoustic wave filter 6 with respect to the electrode finger pitch of the other electrode finger portion, by the ratio of the electrode finger pitch of the narrow-pitch electrode finger portion thereof with respect to the electrode finger pitch of the other electrode finger portion before the pitch is varied: 0.931. That is, each of the values on the horizontal axis is a value represented by: (varied pitch of the narrow-pitch electrode finger portion/pitch of the remaining electrode finger portion)/0.931.

In the longitudinally connected resonator type surface acoustic wave filter 5, the ratio of the electrode finger pitch of the narrow-pitch electrode finger portion with respect to the electrode finger pitch of the remaining electrode finger portion is set to 0.931.

As shown in FIG. 12, the amplitude balance degree is greatly improved by increasing the pitch of the narrow-pitch electrode finger portion of the longitudinally connected resonator type surface acoustic wave filter 6 to be greater than the pitch of the narrow-pitch electrode finger portion of the longitudinally connected resonator type surface acoustic wave filter 5. On the other hand, as shown in FIG. 13, the phase balance degree is greatly improved by reducing the pitch of the narrow-pitch electrode finger portion of the longitudinally connected resonator type surface acoustic wave filter 6 to be less than the pitch of the narrow-pitch electrode finger portion of the longitudinally connected resonator type surface acoustic wave filter 5.

In the first preferred embodiment, both of the amplitude balance degree and phase balance degree are greatly improved by setting the duty of narrow-pitch electrode finger portions to be different between the longitudinally connected resonator type surface acoustic wave filters 5 and 6, whereas, in the second preferred embodiment, either one of the amplitude balance degree and phase balance degree is effectively improved. The second preferred embodiment is, therefore, effective to improve either one of the amplitude balance degree and phase balance degree even though the other of them is thereby deteriorated.

The second preferred embodiment is described using the electrode structure shown in FIG. 1 as an example, but the method by which the electrode finger pitches of the narrow-pitch electrode finger portion are made different from each other, as in the second preferred embodiment, can be utilized in each of the surface acoustic wave filters 200 and 300 shown in FIGS. 23 and 24, respectively. Specifically, in the surface acoustic wave filter 200 shown in FIG. 23, the electrode finger pitch is made different between the narrow-pitch electrode finger portion at the portion where the IDTs 200a and 200b are adjacent to each other, and the portion where the IDTs 200b and 200c are adjacent to each other. Likewise, in the surface acoustic wave filter 300 shown in FIG. 24, the electrode finger pitch is made different between the narrow-pitch electrode finger portion at the portion where the IDTs 300a and 300b are adjacent to each other, and at the portion where the IDTs 300b and 300c are adjacent to each other. The balance degree is thereby improved in a similar manner to the above-described preferred embodiments.

In the second preferred embodiment, surface acoustic wave filters are described having the above-described narrow-pitch electrode finger portion, and having a balanced-unbalanced conversion function. The method in which the balance degree is improved by making the electrode finger pitches of the narrow-pitch electrode finger portion different from each other, can also be applied to the surface acoustic wave filters 100, whereby the amplitude balance degree or the phase balance degree between the balance terminals are improved by making the electrode finger pitch of the narrow-pitch electrode fingers different between the two surface acoustic wave filters. Also, as described above, when attempting to perform a balanced-unbalanced conversion using a single surface acoustic wave filter 200 or 300 shown in FIG. 23 or 24, respectively, the amplitude balance degree or the phase balance degree between the balance terminals is improved by making the electrode finger pitch of the narrow-pitch electrode fingers different between the opposite sides of the central IDT of the single surface acoustic wave filter.

Next, a third preferred embodiment will be described. The third preferred embodiment has an electrode structure similar to that of the first preferred embodiment. That is, the third preferred embodiment uses the electrode structure shown in FIG. 1.

The third preferred embodiment differs from the first preferred embodiment in that, in the first preferred embodiment, the duty of the narrow-pitch electrode finger portion of the second longitudinally connected resonator type surface acoustic wave filter 6 is different from the duty of the narrow-pitch electrode finger portion of the first longitudinally connected resonator type surface acoustic wave filter 5, whereas, in the third preferred embodiment, the electrode finger intercentral distance, at the portion where two electrode fingers are adjacent to each other, are made different at least at one location, between the longitudinally connected resonator type surface acoustic wave filters 5 and 6, to compensate for the difference in the frequency characteristics between the first and second longitudinally connected resonator type surface acoustic wave filters 5 and 6.

The "portion where electrode fingers are adjacent to each other" as described above, refers to the portion where electrode fingers of which the electrode finger pitches are mutually different, are adjacent to each other, such as adjacent electrode fingers at the portion where the narrow-pitch electrode finger portion and the other electrode finger portion are adjacent to each other, and refers further to adjacent electrode fingers at the portion where IDTs are adjacent to each other.

In the third preferred embodiment, the electrode finger intercentral distances, at the portion where these electrode fingers are adjacent to each other, are made different at least at one location, between the longitudinally connected resonator type surface acoustic wave filters 5 and 6, to compensate for the frequency difference between the longitudinally connected resonator type surface acoustic wave filters 5 and 6.

Figure 14:
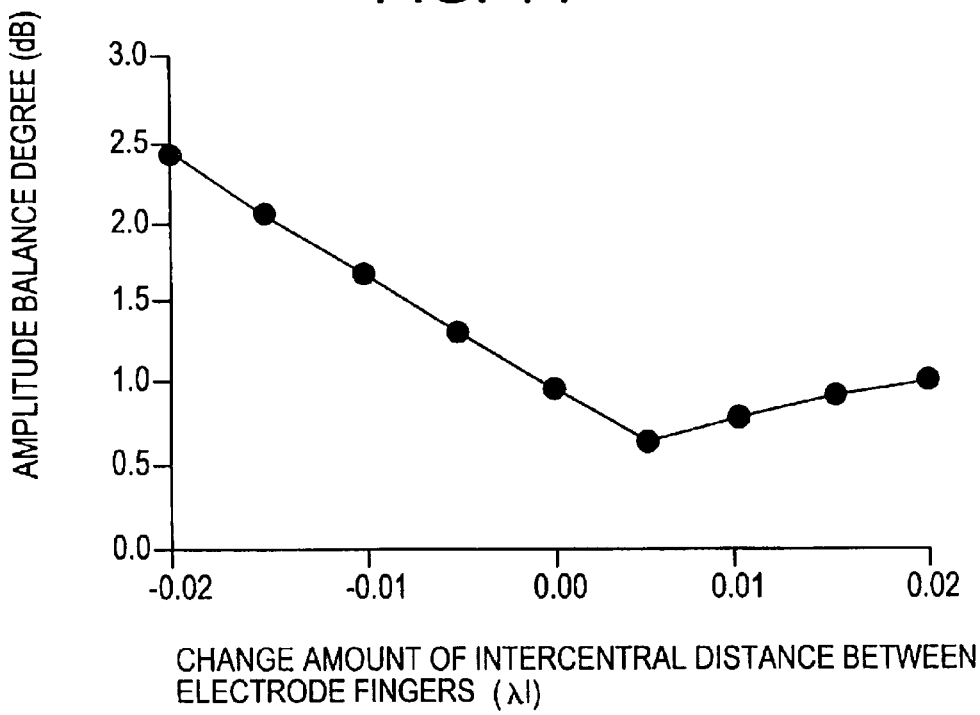
FIG. 14 is a diagram showing the variation in the maximum amplitude balance degree when the IDT to IDT distance in one of the longitudinally connected resonator type surface acoustic wave filters is varied in a third preferred embodiment of the present invention.
Figure 15:
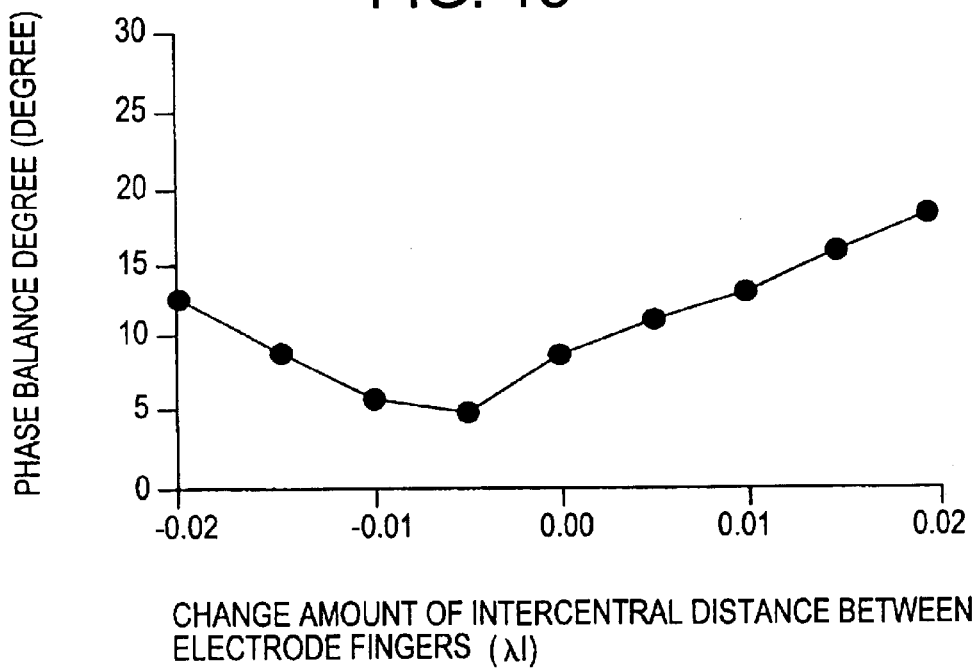
FIG. 15 is a diagram showing the variation in the maximum phase balance degree when the IDT to IDT distance in one of the longitudinally connected resonator type surface acoustic wave filters is varied in the third preferred embodiment of the present invention.

FIGS. 14 and 15 respectively show the variation in the maximum amplitude balance degree and the maximum phase balance degree within the frequency range of a GSM type receiving filter, when, in the second longitudinally connected resonator type surface acoustic wave filter 6, the intercentral distances between adjacent electrode fingers at the portion where the narrow-pitch electrode finger portions $6a_1$ and $6c_1$ in IDTs 6a and 6c and the other electrode finger portion are adjacent to each other, are varied. Taking an IDT 6a as an example, "the intercentral distance A between adjacent electrode fingers" refers to the distance, along the propagation direction of a surface acoustic wave, between the electrode finger $6a_2$ in the narrow-pitch electrode finger portion $6a_1$ and the electrode finger $6a_3$ in the remaining electrode finger portion thereof.

Figure 16:
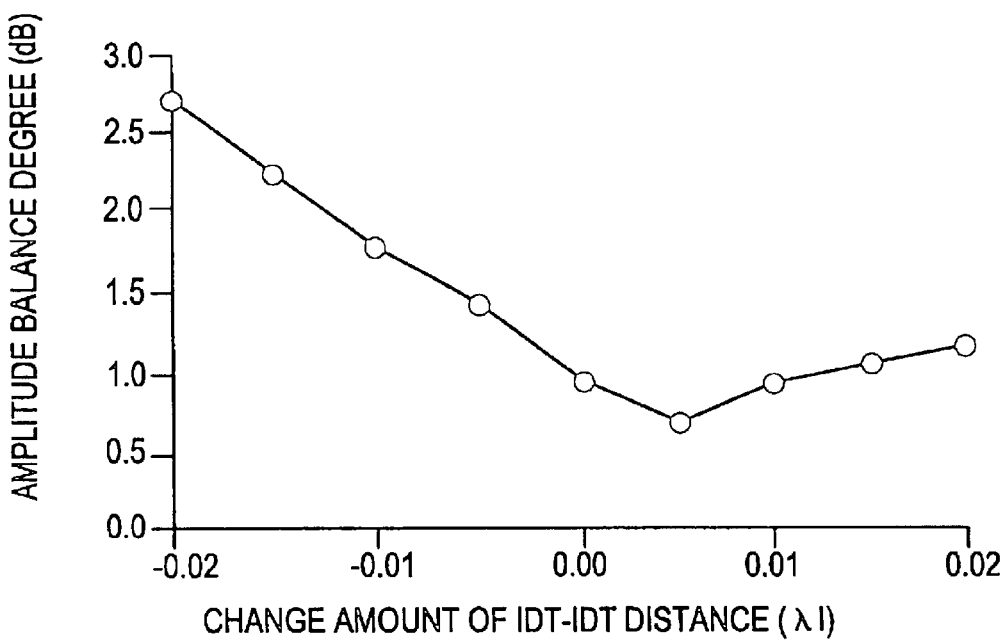
FIG. 16 is a diagram showing the variation in the maximum amplitude balance degree when the IDT to IDT distance in one of the longitudinally connected resonator type surface acoustic wave filters is varied in a third preferred embodiment of the present invention.
Figure 17:
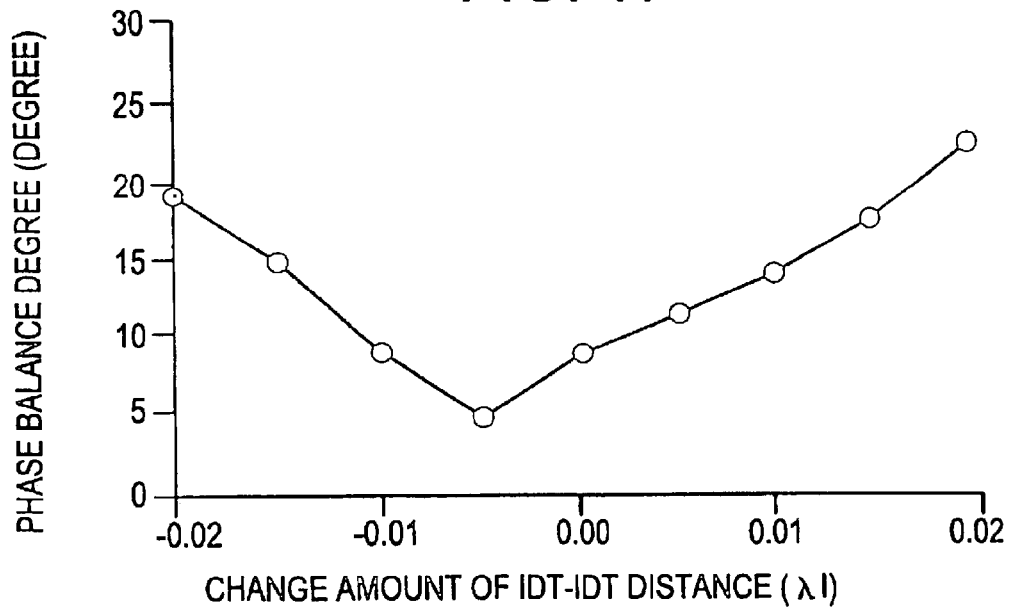
FIG. 17 is a diagram showing the variation in the maximum phase balance degree when the IDT to IDT distance in one of the longitudinally connected resonator type surface acoustic wave filters is varied in the third preferred embodiment of the present invention.

FIGS. 16 and 17 respectively show the variation in the maximum amplitude balance degree and the maximum phase balance degree within the frequency range of a GSM type receiving filter, when, in the second longitudinally connected resonator type surface acoustic wave filter 6, the intercentral distances between adjacent electrode fingers between the adjacent IDTs 6a and 6b, and those between the adjacent IDTs 6b and 6c, are varied.

Figure 18:
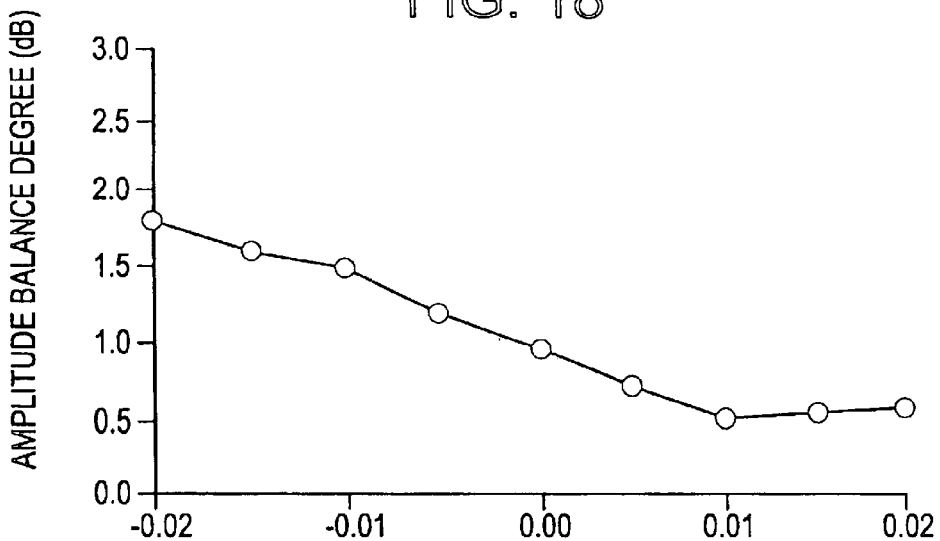
FIG. 18 is a diagram showing the variation in the maximum amplitude balance degree when the IDT to IDT distance in one of the longitudinally connected resonator type surface acoustic wave filters is varied in a third preferred embodiment of the present invention.
Figure 19:
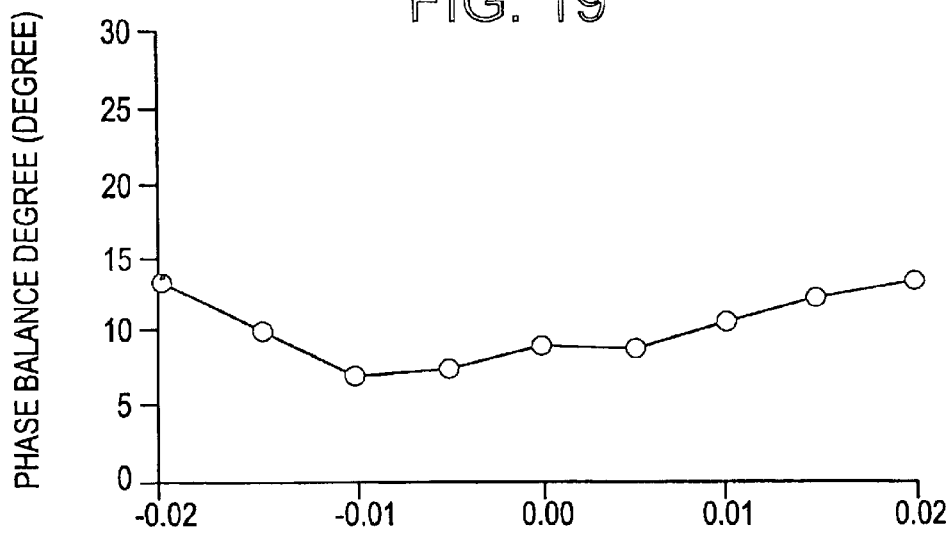
FIG. 19 is a diagram showing the variation in the maximum phase balance degree when the IDT to IDT distance in one of the longitudinally connected resonator type surface acoustic wave filters is varied in the third preferred embodiment of the present invention.

FIGS. 18 and 19 show the variation in the maximum amplitude balance degree and the maximum phase balance degree within the frequency range of a GSM type receiving filter, when, in the second longitudinally connected resonator type surface acoustic wave filter 6, the intercentral distances between adjacent electrode fingers at the portion where the narrow-pitch electrode finger portions $6b_1$ in the second IDT 6b and the remaining electrode finger portion are adjacent to each other, and the intercentral distances between adjacent electrode fingers at the portion where the narrow-pitch electrode finger portions $6b_2$ in the second IDT 6b and the remaining electrode finger portion are adjacent to each other, are varied.

The "0" point on the horizontal axis in FIGS. 14 to 19 means that the above-described intercentral distance of electrode fingers are the same as that in the case of the longitudinally connected resonator type surface acoustic wave filter 5.

It is recognized, from FIGS. 14 to 19, that a range exists wherein the amplitude balance degree and the phase balance degree is improved by varying the intercentral distance of electrode fingers of the longitudinally connected resonator type surface acoustic wave filter 6.

The results shown in FIGS. 14 and 15 are obtained by fixing the intercentral distance of the electrode fingers at the portion where IDTs are adjacent to each other, and the electrode finger intercentral distance of the adjacent electrode fingers between the narrow-pitch electrode finger portions $6b_1$ and $6b_2$ and the remaining electrode finger portion in the IDT 6b, and varying the intercentral distance of the adjacent electrode fingers between the narrow-pitch electrode finger portions $6a_1$ and $6c_1$ and the remaining electrode finger portion in the IDT 6a and 6c. It should also be recognized that the balance degree is improved by varying all these electrode finger intercentral distances.

A similar effect is achieved by differing not only the intercentral distances between the adjacent electrode fingers shown in the third preferred embodiment, but also, to compensate for the difference in the frequency characteristics, at least at one location, between the first and second longitudinally connected resonator type surface acoustic wave filter 5 and 6, by making distance of adjacent electrode fingers different from $0.5\lambda I$, or by making the distance between adjacent electrode fingers different from $(0.25\lambda I1+0.25\lambda I2)$, in the portion where the electrode pitch of adjacent electrode fingers are mutually different.

As described above, in the third preferred embodiment, at the portion where the electrode finger portions having mutually different pitches are adjacent to each other, the intercentral distances between adjacent electrode fingers are set to be different between the first and second longitudinally connected resonator type surface acoustic wave filters, but such a configuration may also be applied to the surface acoustic wave filter 200 and 300 shown in FIGS. 23 and 24, respectively. The intercentral distance of the adjacent electrode fingers at the portion where the IDTs 200a and 200b are adjacent to each other is different from that between the adjacent electrode fingers at the portion where the IDTs 200b and 200c are adjacent to each other. Likewise, in the surface acoustic wave filter 300, the IDT-IDT distance is different between the opposite sides of the IDT 300b. Thus, when performing a balanced-unbalanced conversion using two surface acoustic wave filters by a similar method to the third preferred embodiment, the amplitude balance degree or the phase balance degree are improved by setting the intercentral distances between adjacent electrode fingers to be different at least at one location. On the other hand, when performing a balanced-unbalanced conversion using a single surface acoustic wave filter as shown in FIGS. 23 and 24, the amplitude balance degree or the phase balance degree is improved by setting the electrode finger pitch of the narrow-pitch electrode fingers between the opposite sides of the central IDT to be different at least at one location.

Figure 20:
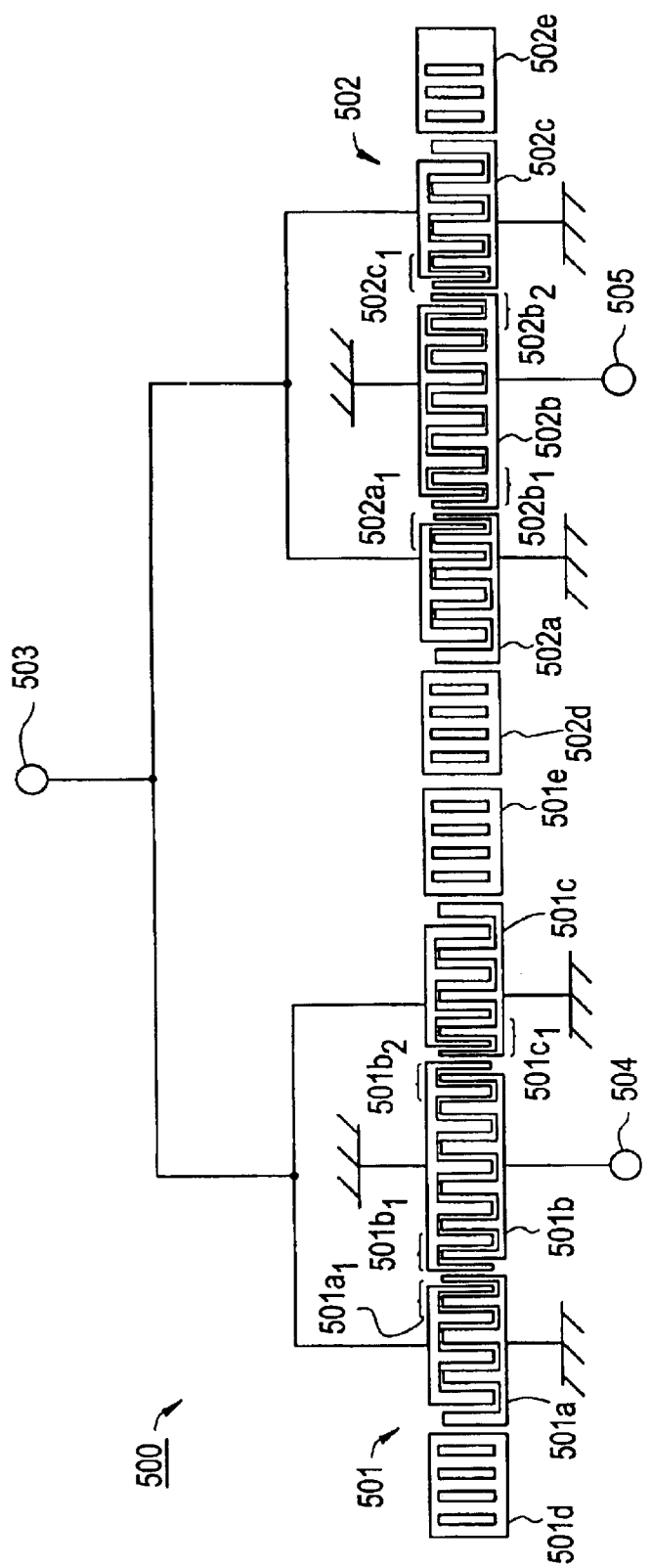
FIG. 20 is a schematic plan view showing the electrode structure of a longitudinally connected resonator type surface acoustic wave filter in accordance with a fourth preferred embodiment of the present invention.
Figure 22:
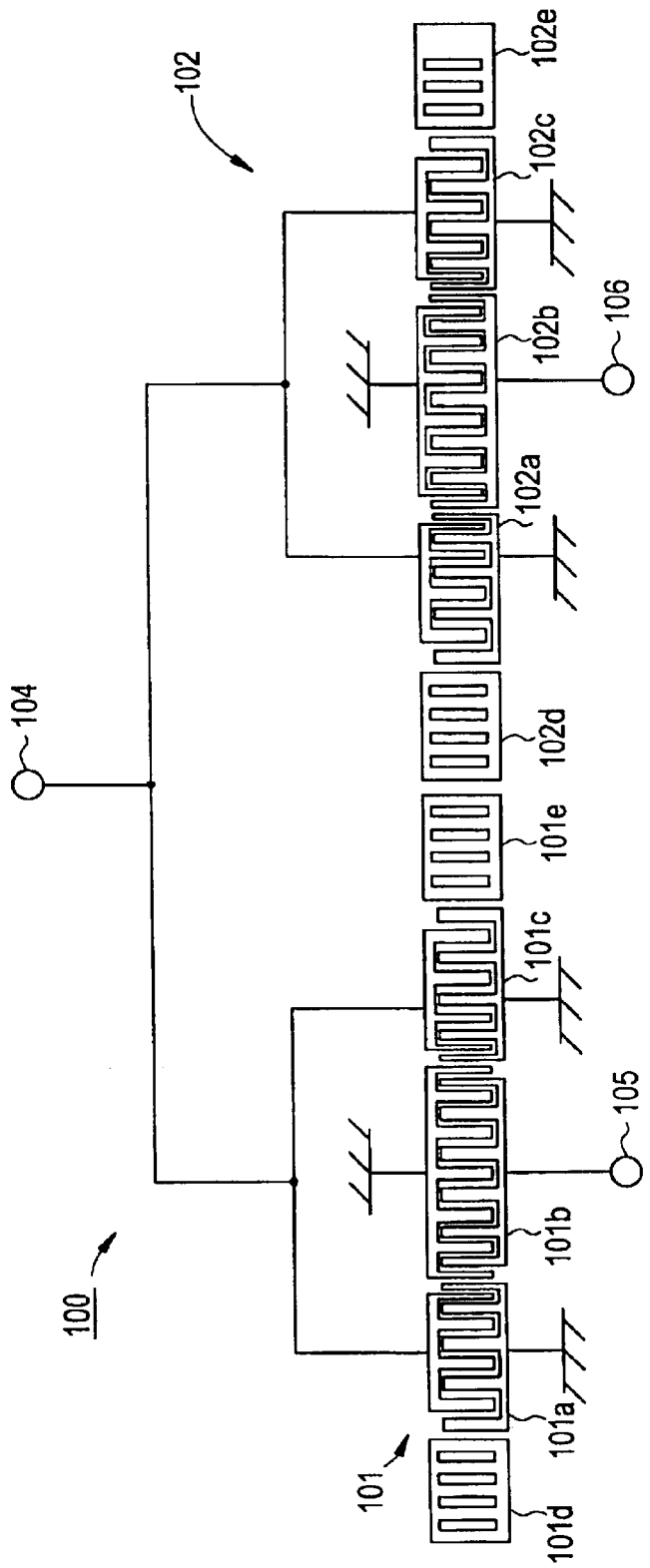
FIG. 22 is a schematic plan view showing an example of a conventional longitudinally connected resonator type surface acoustic wave filter.

FIG. 20 is a schematic plan view showing the electrode structure of a longitudinally connected resonator type surface acoustic wave filter in accordance with a fourth preferred embodiment of the present invention. In the longitudinally connected resonator type surface acoustic wave filter 500 in accordance with this preferred embodiment, the electrode structure is the same as that of the conventional longitudinally connected resonator type surface acoustic wave filter shown in FIG. 22.

The longitudinally connected resonator type surface acoustic wave filter 500 includes first and second longitudinally connected resonator type surface acoustic wave filters 501 and 502. The longitudinally connected resonator type surface acoustic wave filters 501 and 502 include first to third IDTs 501a to 501c, and 502a to 502c, respectively, arranged along the propagation direction of a surface acoustic wave, and reflectors 501d and 501e, and 502d and 502e disposed on opposite sides of each of the areas where the IDTs are arranged along the propagation direction of a surface acoustic wave. One side end of each of the IDT 501a and 501c is commonly connected to an unbalanced signal terminal 503. To this unbalanced signal terminal 503, one side end of each of the first and third IDTs 502a and 502c of the longitudinally connected resonator type surface acoustic wave filter 502 is commonly connected.

One side end of each of the IDTs 501b and 502b is connected to balanced signal terminals 504 and 505, respectively. The other end of each of the IDTs 501a to 501c, and 502a to 502c is connected to the ground potential.

Here, the first terminals of the above-described longitudinally connected resonator type surface acoustic wave filters 501 and 502 are arranged to include a terminal to which the IDTs 501a and 501c are commonly connected, and a terminal to which the IDTs 502a and 502c are commonly connected. Also, one side end of each of the IDT 501b and 502b corresponds to second terminals of the longitudinally connected resonator type surface acoustic wave filters 501 and 502 and connected to the balanced signal terminals 504 and 505, respectively.

In this preferred embodiment, the IDTs 501a to 501c, and 502a to 502c have no narrow-pitch electrode finger portion, but have chirp type electrode finger portions $501a_1$, $501b_1$, $501b_2$, and $501c_1$; and $502a_1$, $502b_1$, $502b_2$, and $502c_1$, respectively. More specifically, these IDTs are configured as chirp type electrode finger portions in each of which, at the portion where IDTs are adjacent to each other, one portion of electrode fingers from the end of an IDT is linearly changed along the propagation direction of a surface acoustic wave.

The configuration of each of the chirp type electrode finger portions is different between the longitudinally connected resonator type surface acoustic wave filters 501 and 502.

In the fourth preferred embodiment, however, the amplitude balance degree or the phase balance degree is greatly improved just as in the case of the first to third preferred embodiment, since the configuration of each of the chirp type electrode finger portions is different between the longitudinally connected resonator type surface acoustic wave filters 501 and 502.

The method in which the amplitude balance degree or the phase balance degree is improved by making the configuration of the chirp type electrode finger portions differ, as in the fourth preferred embodiment, can also be applied where a balanced-unbalanced conversion is performed using a single longitudinally connected resonator type surface acoustic wave filter, such as a surface acoustic wave filter 200 or 300 shown in FIG. 23 or 24, respectively. Specifically, when performing a balanced-unbalanced conversion using a single surface acoustic wave filter, the amplitude balance degree or the phase balance degree between the balanced terminals is improved by making the configurations of the chirp type electrode fingers disposed on the opposite sides of the central IDT different from each other.

In the above-described first to fourth preferred embodiments, the balance degrees are improved by differing the duty of narrow-pitch electrode finger portion, the electrode finger pitch of narrow-pitch electrode finger portion, the IDT-IDT distance portion, or the configuration of chirp type electrode finger portion. When performing a balanced-unbalanced conversion using the first and second longitudinally connected resonator type surface acoustic wave filters, the improvement in the balance degree is achieved by differing the above-described parameter between the first and second longitudinally connected resonator type surface acoustic wave filters. On the other hand, when performing a balanced-unbalanced conversion using a single longitudinally connected resonator type surface acoustic wave filter, the improvement in the balance degree is achieved by differing the above-described parameter between the opposite sides of the central IDT of the single surface acoustic wave filter. Alternatively, two or more of these methods may be combined, which allows a more effective improvement in the balance degree.

Figure 21:
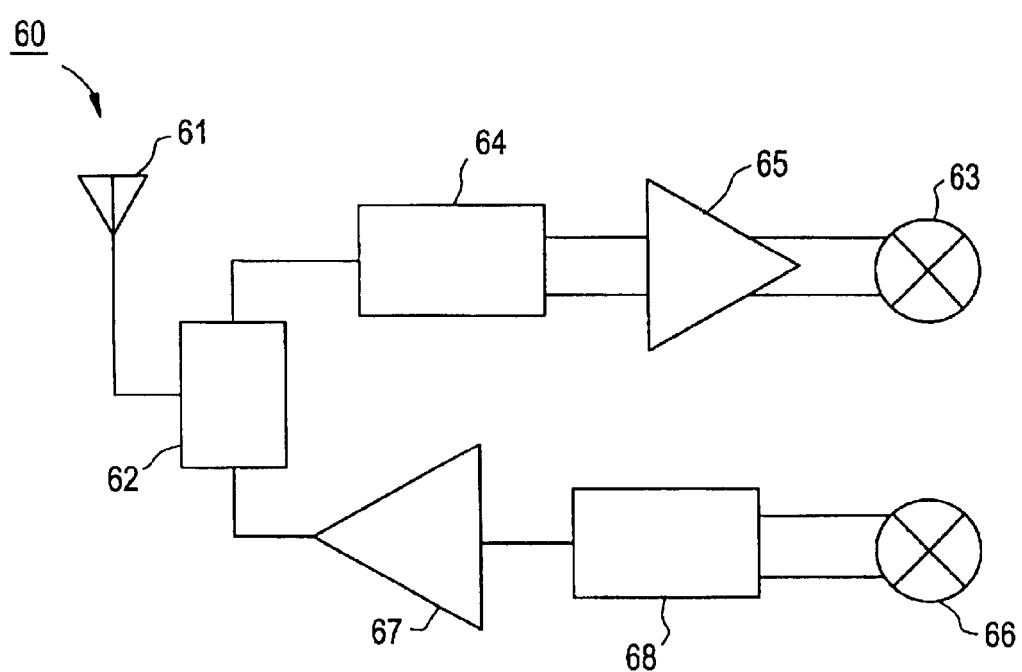
FIG. 21 is a schematic bock diagram for explaining a communication device using a longitudinally connected resonator type surface acoustic wave filter in accordance with the present invention.

FIG. 21 is a schematic bock diagram for explaining a communication device 60 using a longitudinally connected resonator type surface acoustic wave filter in accordance with the present invention.

In FIG. 21, a duplexer 62 is connected to an antenna 61. A surface acoustic wave filter 64 and an amplifier 65 are connected between the duplexer 62 and a reception-side mixer 63. An amplifier 67 and a surface acoustic wave filter 68 are connected between the duplexer 62 and a transmission-side mixer 66. When the amplifier 65 is adapted to balanced signals, the longitudinally connected resonator type surface acoustic wave filter in accordance with the present invention are suitably used as the above-described surface acoustic wave filter 64.

In such a communication device 60, use of a longitudinally connected resonator type surface acoustic wave filter configured in accordance with the present invention enables a widened bandwidth, the improvement in the flatness of insertion loss in a pass band, and the improvement in VSWR (voltage standing wave ratio) to be achieved.

As is evident from the foregoing, in the longitudinally connected resonator type surface acoustic wave filter in accordance with the first aspect of the present invention, since a balanced-unbalanced conversion is achieved using the first and second longitudinally connected resonator type surface acoustic wave filters, and the duties of electrode fingers in the narrow-pitch electrode finger portion are different between the first and second longitudinally connected resonator type surface acoustic wave filters, the balance degree between a pair of balanced signal terminals is effectively improved.

In the longitudinally connected resonator type surface acoustic wave filter in accordance with the second aspect of the present invention, since a balanced-unbalanced conversion is achieved using the first and second longitudinally connected resonator type surface acoustic wave filters, and the pitches of electrode fingers in the narrow-pitch electrode finger portion are different between the first and second longitudinally connected resonator type surface acoustic wave filters, the balance degree between a pair of balanced signal terminals is effectively improved.

In the longitudinally connected resonator type surface acoustic wave filter in accordance with the third aspect of the present invention, since a balanced-unbalanced conversion is achieved using the first and second longitudinally connected resonator type surface acoustic wave filters, and the intercentral distance of adjacent electrode fingers is different between the first and second longitudinally connected resonator type surface acoustic wave filters, at least at one location, the balance degree between a pair of balanced signal terminals is effectively improved.

In the longitudinally connected resonator type surface acoustic wave filter in accordance with the fourth aspect of the present invention, since the intercentral distance of the two adjacent electrode fingers between adjacent IDTs, and/or the intercentral distance of the two adjacent electrode fingers between the narrow-pitch electrode finger portion and the remaining electrode finger portion, are different between the first and second longitudinally connected resonator type surface acoustic wave filters, the balance degree between a pair of balanced signal terminals is effectively improved.

In the fifth aspect of the present invention, since at least two kinds of the particular features are provided in accordance with the first to fourth aspects, the balance degree between a pair of balanced signal terminals is more effectively improved.

In the longitudinally connected resonator type surface acoustic wave filter in accordance with the sixth aspect of the present invention, since each of the first and second longitudinally connected resonator type surface acoustic wave filters has chirp type electrode finger portions, in each of which the pitch of one electrode finger portion from the adjacent IDT-side end of the each IDT is linearly changed along the propagation direction of a surface acoustic wave, and since the configuration of the chirp type electrode finger portion is different between the first and second longitudinally connected resonator type surface acoustic wave filters, the balance degree between a pair of balanced signal terminals is effectively improved.

In the longitudinally connected resonator type surface acoustic wave filter in accordance with the seventh aspect of the present invention, since a balanced-unbalanced conversion is achieved using the single longitudinally connected resonator type surface acoustic wave filter, and the duty of the electrode fingers in the narrow-pitch electrode finger portion is different between the portion where the first and second IDTs are adjacent to each other, and the portion where the second and third IDTs are adjacent to each other, the balance degree between a pair of balanced signal terminals is effectively improved.

In the longitudinally connected resonator type surface acoustic wave filter in accordance with the eighth aspect of the present invention, since a balanced-unbalanced conversion is achieved using the single longitudinally connected resonator type surface acoustic wave filter, and the pitch of the electrode fingers in the narrow-pitch electrode finger portion is different between the portion where the first and second IDTs are adjacent to each other, and the portion where the second and third IDTs are adjacent to each other, the balance degree between a pair of balanced signal terminals is effectively improved.

In the longitudinally connected resonator type surface acoustic wave filter in accordance with the ninth aspect of the present invention, since a balanced-unbalanced conversion is achieved using the single longitudinally connected resonator type surface acoustic wave filter, and if we denote the middle point of the second IDT as a center, the distance between two adjacent electrode fingers is different between the opposite sides of the above-described center, at least at one location, the balance degree between a pair of balanced signal terminals is effectively improved.

In the longitudinally connected resonator type surface acoustic wave filter in accordance with the tenth aspect of the present invention, since a balanced-unbalanced conversion is achieved using the single longitudinally connected resonator type surface acoustic wave filter, and the intercentral distance of the two adjacent electrode fingers between adjacent IDTs, and/or the intercentral distance of the two adjacent electrode fingers between the narrow-pitch electrode finger portion and the electrode finger portion other than the narrow-pitch electrode finger portion, are different between the opposite sides of the second IDT, the balance degree between a pair of balanced signal terminals is effectively improved.

In the longitudinally connected resonator type surface acoustic wave filter in accordance with the eleventh aspect of the present invention, since there are provided at least two kinds of the features in accordance with the seventh to tenth aspects, the balance degree between a pair of balanced signal terminals is more effectively improved.

In the longitudinally connected resonator type surface acoustic wave filter in accordance with the twelfth aspect of the present invention, a single longitudinally connected resonator type surface acoustic wave filter having the first to third IDTs is used, and in each of the IDTs, a chirp type electrode finger portion is provided at the portion where the first and second IDTs are adjacent to each other and at the portion where the second and third IDTs are adjacent to each other. Furthermore, since the structure of this chirp type electrode finger portion is different between the portion where the first and second IDTs are adjacent to each other, and the portion where the second and third IDTs are adjacent to each other, the balance degree between a pair of balanced signal terminals is more effectively improved.

In the longitudinally connected resonator type surface acoustic wave filter in accordance with the thirteenth aspect of the present invention, among the first to third IDTs, the second IDT is divided into two portions, and a pair of balanced terminals extend from the second IDT which has been divided into two portions while an unbalanced terminal extends from the first and third IDTs, whereby this longitudinally connected resonator type surface acoustic wave filter has a balanced-unbalanced conversion function. In this longitudinally connected resonator type surface acoustic wave filter, since the duty of the electrode fingers in the narrow-pitch electrode finger portion is different between the portion where the first and second IDTs are adjacent to each other, and the portion where the second and third IDTs are adjacent to each other, the balance degree between a pair of balanced signal terminals is more effectively improved.

Likewise, the longitudinally connected resonator type surface acoustic wave filter in accordance with the fourteen to sixteen aspects of the present invention is configured such that the second IDT is divided into two portions, and a pair of balanced terminals extend from the second IDT which has been divided into two portions, while an unbalanced terminal extend from the first and third IDTs. In this configuration, since there are provided the structure wherein the electrode finger pitches in the narrow-pitch electrode finger portion is different between the portion where the first and second IDTs are adjacent to each other, and the portion where the second and third IDTs are adjacent to each other, the structure wherein, if we let the middle point of the second IDT is a center, the distance between two adjacent electrode fingers is different between the opposite sides of the above-described center, at least at one location, and the structure wherein the intercentral distance of the two adjacent electrode fingers between adjacent IDTs, and/or the intercentral distance of the two adjacent electrode fingers between the narrow-pitch electrode finger portion and the electrode finger portion other than the narrow-pitch electrode finger portion, are different between the opposite sides of the second IDT, the balance degree between a pair of balanced signal terminals can be more effectively improved.

In the longitudinally connected resonator type surface acoustic wave filter in accordance with the seventeen aspect of the present invention, since at least two kinds of characteristic features in accordance with the thirteen to sixteenth aspects are provided, the balance degree between a pair of balanced signal terminals is more effectively improved.

While the present invention has been described with reference to the preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A longitudinally connected resonator type surface acoustic wave filter, comprising:

first and second longitudinally connected resonator type surface acoustic wave filters each having a plurality of IDTs which are successively arranged on a piezoelectric substrate along a propagation direction of a surface acoustic wave; wherein said first longitudinally connected resonator type surface acoustic wave filter has a transmission phase that is substantially opposite to a transmission phase of said second longitudinally connected resonator type surface acoustic wave filter;

first terminals of said first and second longitudinally connected resonator type surface acoustic wave filters each defining unbalanced terminals by being connected in parallel with each other, and second terminals of said first and second longitudinally connected resonator type surface acoustic wave filters defining balanced terminals by being connected via a ground or connected in series with each other, whereby said longitudinally connected resonator type surface acoustic wave filter has a balanced-unbalanced conversion function;

wherein in said first and second longitudinally connected resonator type surface acoustic wave filters, each of said plurality of IDTs includes a narrow-pitch electrode finger portion, and the pitch of one electrode finger portion from the adjacent IDT-side end of said each IDT, is narrower than that of other electrode finger portions of the IDT; and the duty of the electrode fingers in said narrow-pitch electrode finger portion is different between said first and second longitudinally connected resonator type surface acoustic wave filters.

2. A longitudinally connected resonator type surface acoustic wave filter, comprising:

first and second longitudinally connected to resonator type surface acoustic wave filters each having a plurality of IDTs successively arranged on a piezoelectric substrate along a propagation direction of a surface acoustic wave; wherein said first longitudinally connected resonator type surface acoustic wave filter has a transmission phase that is substantially opposite to a transmission phase of said second longitudinally connected resonator type surface acoustic wave filter;

first terminals of said first and second longitudinally connected resonator type surface acoustic wave filters each arranged to define unbalanced terminals by being connected in parallel with each other, and second terminals of said first and second longitudinally connected resonator type surface acoustic wave filters are arranged to define balanced terminals by being connected via a ground or by being connected in series with each other, whereby said longitudinally connected resonator type surface acoustic wave filter has a balanced-unbalanced conversion function;

wherein in said first and second longitudinally connected resonator type surface acoustic wave filters, each of said plurality of IDTs includes a narrow-pitch electrode finger portion, and the pitch of one electrode finger portion from the adjacent IDT-side end of said each IDT is narrower than that of other electrode finger portions of the IDT; and the pitch of the electrode fingers in said narrow-pitch electrode finger portion is different between said first and second longitudinally connected resonator type surface acoustic wave filters.

3. A longitudinally connected resonator type surface acoustic wave filter, comprising:

first and second longitudinally connected resonator type surface acoustic wave filters each having a plurality of IDTs successively arranged on a piezoelectric substrate along the propagation direction of a surface acoustic wave; wherein said first longitudinally connected resonator type surface acoustic wave filter has a transmission phase that is substantially opposite to a transmission phase of said second longitudinally connected resonator type surface acoustic wave filter;

first terminals of said first and second longitudinally connected resonator type surface acoustic wave filters each being arranged to define unbalanced terminals by being connected in parallel with each other, and second terminals of said first and second longitudinally connected resonator type surface acoustic wave filters each being arranged to define balanced terminals by being connected via a ground or by being connected in series with each other, whereby said longitudinally connected resonator type surface acoustic wave filter has a balanced-unbalanced conversion function;

wherein in said first and second longitudinally connected resonator type surface acoustic wave filters, each of said plurality of IDTs including a narrow-pitch electrode finger portion, and the pitch of one electrode finger portion from the adjacent IDT-side end of said each IDT is narrower than that of other electrode finger portions of the IDT; and the intercentral distance of two adjacent electrode fingers is different between said first and second longitudinally connected resonator type surface acoustic wave filters, at least at one location.

4. A longitudinally connected resonator type surface acoustic wave filter, comprising:

first and second longitudinally connected resonator type surface acoustic wave filters each having a plurality of IDTs successively arranged on a piezoelectric substrate along the propagation direction of a surface acoustic wave; wherein said first longitudinally connected resonator type surface acoustic wave filter has a transmission phase that is substantially opposite to a transmission phase of said second longitudinally connected resonator type surface acoustic wave filter;

first terminals of said first and second longitudinally connected resonator type surface acoustic wave filters each is arranged to define unbalanced terminals by being connected in parallel with each other, and second terminals of said first and second longitudinally connected resonator type surface acoustic wave filters each defining balanced terminals by being connected via a ground or by being connected in series with each other, whereby said longitudinally connected resonator type surface acoustic wave filter has a balanced-unbalanced conversion function;

wherein in said first and second longitudinally connected resonator type surface acoustic wave filters, each of said plurality of IDTs including a narrow-pitch electrode finger portion, and the pitch of one electrode finger portion from the adjacent IDT-side end of said each IDT is narrower than that of other electrode finger portions of the IDT; and at least one of the intercentral distance of the two adjacent electrode fingers between adjacent IDTs and the intercentral distance of the two adjacent electrode fingers between the narrow-pitch electrode finger portion and the remaining electrode finger portion, is different between said first and second longitudinally connected resonator type surface acoustic wave filters.

5. A longitudinally connected resonator type surface acoustic wave filter, comprising:

first and second longitudinally connected resonator type surface acoustic wave filters each having a plurality of IDTs successively arranged on a piezoelectric substrate along the propagation direction of a surface acoustic wave; wherein said first longitudinally connected resonator type surface acoustic wave filter has a transmission phase that is substantially opposite to a transmission phase of said second longitudinally connected resonator type surface acoustic wave filter;

first terminals of said first and second longitudinally connected resonator type surface acoustic wave filters each defining unbalanced terminals by being connected in parallel with each other, and second terminals of said first and second longitudinally connected resonator type surface acoustic wave filters each defining balanced terminals by being connected via a ground or in series with each other, whereby said longitudinally connected resonator type surface acoustic wave filter has a balanced-unbalanced conversion function;

wherein in said first and second longitudinally connected resonator type surface acoustic wave filters, each of said plurality of IDTs including a narrow-pitch electrode finger portion, and the pitch of one electrode finger portion from the adjacent IDT-side end of said each IDT is narrower than that of other electrode finger portions of the IDT; and said longitudinally connected resonator type surface acoustic wave filter further including at least two of the following features (a) to (d):

(a) the duty of the electrode fingers in said narrow-pitch electrode finger portion is different between said first and second longitudinally connected resonator type surface acoustic wave filters;

(b) the pitch of the electrode fingers in said narrow-pitch electrode finger portion is different between said first and second longitudinally connected resonator type surface acoustic wave filters;

(c) the intercentral distance of two adjacent electrode fingers is different between said first and second longitudinally connected resonator type surface acoustic wave filters, at at least at one location; and (d) at least one of the intercentral distance of the two adjacent electrode fingers between adjacent IDTs and the intercentral distance of the two adjacent electrode fingers between a narrow-pitch electrode finger portion and the remaining electrode finger portion, is different between said first and second longitudinally connected resonator type surface acoustic wave filters.

6. A longitudinally connected resonator type surface acoustic wave filter, comprising:

first and second longitudinally connected resonator type surface acoustic wave filters each having a plurality of IDTs successively arranged on a piezoelectric substrate along the propagation direction of a surface acoustic wave; wherein said first longitudinally connected resonator type surface acoustic wave filter has a transmission phase that is substantially opposite to a transmission phase of said second longitudinally connected resonator type surface acoustic wave filter;

first terminals of said first and second longitudinally connected resonator type surface acoustic wave filters each defining unbalanced terminals by being connected in parallel with each other, and second terminals of said first and second longitudinally connected resonator type surface acoustic wave filters each defining balanced terminals by being connected via a ground or by being connected in series with each other, whereby said longitudinally connected resonator type surface acoustic wave filter has a balanced-unbalanced conversion function;

each of said first and second longitudinally connected resonator type surface acoustic wave filters has, in each of the plural IDTs thereof, a chirp type electrode finger portion, wherein the pitch of one electrode finger portion from the adjacent IDT-side end of said each IDT is linearly changed along the propagation direction of a surface acoustic wave; and the configuration of said chirp type electrode finger portion is different between said first and second longitudinally connected resonator type surface acoustic wave filters.

7. A longitudinally connected resonator type surface acoustic wave filter, comprising:

first, second and third IDTs successively arranged on a piezoelectric substrate along the propagation direction of a surface acoustic wave; wherein the first and third IDTs have an opposite phase to the phase of the second IDT;

an unbalanced terminal extending from the second IDT and a balanced terminal extending from each of the first and third IDTs, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is made narrower than that of other electrode finger portions of the IDT; and the duty of the electrode fingers in said narrow-pitch electrode finger portion is different between a portion where the first and second IDTs are adjacent to each other, and a portion where the second and third IDTs are adjacent to each other.

8. A longitudinally connected resonator type surface acoustic wave filter, comprising:

first, second and third IDTs successively arranged on a piezoelectric substrate along the propagation direction of a surface acoustic wave; wherein the first and third IDTs have an opposite phase to the phase of the second IDT;

an unbalanced terminal extending from the second IDT and a balanced terminal extending from each of the first and third IDTs, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is made narrower than that of other electrode finger portions of the IDT; and the pitch of the electrode fingers in said narrow-pitch electrode finger portion is different between a portion where the first and second IDTs are adjacent to each other, and a portion where the second and third IDTs are adjacent to each other.

9. A longitudinally connected resonator type surface acoustic wave filter, comprising:

first, second and third IDTs successively arranged on a piezoelectric substrate along the propagation direction of a surface acoustic wave; wherein the first and third IDTs have an opposite phase to the phase of the second IDT;

an unbalanced terminal extending from the second IDT and a balanced terminal extending from each of the first and third IDTs, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is made narrower than that of other electrode finger portions of the IDT; and the distance between two adjacent electrode fingers of the second IDT is different on opposite sides equidistant from a middle point of the second IDT, at least at one location.

10. A longitudinally connected resonator type surface acoustic wave filter, comprising:

first, second and third IDTs successively arranged on a piezoelectric substrate along the propagation direction of a surface acoustic wave; wherein the first and third IDTs have an opposite phase to the phase of the second IDT;

an unbalanced terminal extending from the second IDT and a balanced terminal extending from each of the first and third IDTs, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is made narrower than that of other electrode finger portions of the IDT; and the intercentral distance of two adjacent electrode fingers between adjacent IDTs are different between the opposite sides of the second IDT and the intercentral distance of two adjacent electrode fingers between a narrow-pitch electrode finger portion and the electrode finger portion other than the narrow-pitch electrode finger portion are different between the opposite sides of the second IDT.

11. A longitudinally connected resonator type surface acoustic wave filter, comprising:

first, second and third IDTs successively arranged on a piezoelectric substrate along the propagation direction of a surface acoustic wave; wherein the first and third IDTs have an opposite phase to the phase of the second IDT;

an unbalanced terminal extending from the second IDT and a balanced terminal extending from each of the first and third IDTs, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is made narrower than that of other electrode finger portions of the IDT; and said longitudinally connected resonator type surface acoustic wave filter further including at least two of the following features (a) to (d):

(a) the duty of the electrode fingers in said narrow-pitch electrode finger portion is different between the portion where the first and second IDTs are adjacent to each other, and the portion where the second and third IDTs are adjacent to each other;

(b) the pitch of electrode fingers in said narrow-pitch electrode finger portion is different between the portion where the first and second IDTs are adjacent to each other, and the portion where the second and third IDTs are adjacent to each other;

(c) the distance between two adjacent electrode fingers of the second IDT is different on opposite sides equidistant from a middle point of the second IDT, at least at one location; and (d) the intercentral distance of two adjacent electrode fingers between adjacent IDTs are different between the opposite sides of the second IDT and/or the intercentral distance of two adjacent electrode fingers between the narrow-pitch electrode finger portion and the electrode finger portion other than the narrow-pitch electrode finger portion are different between the opposite sides of the second IDT.

12. A longitudinally connected resonator type surface acoustic wave filter, comprising:

first, second and third IDTs successively arranged on a piezoelectric substrate along the propagation direction of a surface acoustic wave; wherein the first and third IDTs have an opposite phase to the phase of the second IDT;

an unbalanced terminal extending from the second IDT and a balanced terminal extending from each of the first and third IDTs, whereby said longitudinally connected resonator type surface acoustic wave filter has a balanced-unbalanced conversion function;

each of said IDTs includes a chirp type electrode finger portion wherein the pitch of one electrode finger portion from the adjacent IDT-side end of said each IDT is linearly changed along the propagation direction of a surface acoustic wave; and the configuration of said chirp type electrode finger portion is different between a portion where the first and second IDTs are adjacent to each other, and a portion where the second and third IDTs are adjacent to each other.

13. A longitudinally connected resonator type surface acoustic wave filter, comprising:

first, second and third IDTs successively arranged on a piezoelectric substrate along the propagation direction of a surface acoustic wave; wherein the second IDT is divided into two portions, the first and third IDTs having an opposite phase to the phase of the second IDT, an unbalanced terminal extending from each of the first and third IDTs, and a pair of balanced terminals extending from the second IDT which has been divided into two portions, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is narrower than the pitch of the other electrode finger portion of the IDT; and the duty of the electrode fingers in said narrow-pitch electrode finger portion is different between a portion where the first and second IDTs are adjacent to each other, and a portion where the second and third IDTs are adjacent to each other.

14. A longitudinally connected resonator type surface acoustic wave filter, comprising:

first, second and third IDTs successively arranged on a piezoelectric substrate along the propagation direction of a surface acoustic wave; wherein the second IDT is divided into two portions, the first and third IDTs having an opposite phase to the phase of the second IDT, an unbalanced terminal extending from each of the first and third IDTs, and a pair of balanced terminals extending from the second IDT which is divided into the two portions, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is narrower than the pitch of the other electrode finger portion of the IDT; and the pitch of the electrode fingers in said narrow-pitch electrode finger portion is different between a portion where the first and second IDTs are adjacent to each other, and a portion where the second and third IDTs are adjacent to each other.

15. A longitudinally connected resonator type surface acoustic wave filter, comprising:

first, second and third IDTs successively arranged on a piezoelectric substrate along the propagation direction of a surface acoustic wave; wherein the second IDT is divided into two portions, the first and third IDTs having an opposite phase to the phase of the second IDT, an unbalanced terminal extending from each of the first and third IDTs, and a pair of balanced terminals extending from the second IDT which is divided into the two portions, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is narrower than the pitch of the other electrode finger portion of the IDT; and the distance between two adjacent electrode fingers of the second IDT is different on opposite sides equidistant from a middle point of the second IDT, at least at one location.

16. A longitudinally connected resonator type surface acoustic wave filter, comprising:

first, second and third IDTs successively arranged on a piezoelectric substrate along the propagation direction of a surface acoustic wave; wherein the second IDT is divided into two portions, the first and third IDTs having an opposite phase to the phase of the second IDT, an unbalanced terminal extending from each of the first and third IDTs, and a pair of balanced terminals extending from the second IDT which is divided into the two portions, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is narrower than the pitch of the other electrode finger portion of the IDT; and the intercentral distance of the two adjacent electrode fingers between adjacent IDTs are different between opposite sides of the second IDT and the intercentral distance of the two adjacent electrode fingers between the narrow-pitch electrode finger portion and the electrode finger portion other than the narrow-pitch electrode finger portion are different between opposite sides of the second IDT.

17. A longitudinally connected resonator type surface acoustic wave filter, comprising:

first, second and third IDTs successively arranged on a piezoelectric substrate along the propagation direction of a surface acoustic wave; wherein the second IDT is divided into two portions, the first and third IDTs having an opposite phase to the phase of the second IDT, an unbalanced terminal extending from each of the first and third IDTs, and a pair of balanced terminals extending from the second IDT which is divided into the two portions, whereby said longitudinally connected resonator type surface acoustic wave filter has a balanced-unbalanced conversion function;

each of the IDTs includes a narrow-pitch electrode finger portion wherein the pitch of one electrode finger portion from the adjacent IDT-side end of said each IDT is narrower than the pitch of the other electrode finger portion of the IDT; and said longitudinally connected resonator type surface acoustic wave filter further comprising at least two of the following features (a) to (d):

(a) the duty of the electrode fingers in said narrow-pitch electrode finger portion is different between a portion where the first and second IDTs are adjacent to each other, and a portion where the second and third IDTs are adjacent to each other;

(b) the pitch of the electrode fingers in said narrow-pitch electrode finger portion is different between the portion where the first and second IDTs are adjacent to each other, and the portion where the second and third IDTs are adjacent to each other;

(c) the distance between two adjacent electrode fingers of the second IDT is different on opposite sides equidistant from a middle point of the second IDT, at least at one location; and (d) at least one of the intercentral distance of the two adjacent electrode fingers between adjacent IDTs and the intercentral distance of the two adjacent electrode fingers between the narrow-pitch electrode finger portion and the electrode finger portion other than the narrow-pitch electrode finger portion is different between the opposite sides of the second IDT.

18. A longitudinally connected resonator type surface acoustic wave filter, comprising:

first, second and third IDTs successively arranged on a piezoelectric substrate along the propagation direction of a surface acoustic wave; wherein the second IDT is divided into two portions, the first and third IDTs having an opposite phase to the phase of the second IDT, an unbalanced terminal extending from each of the first and third IDTs, and a pair of balanced terminals extending from the second IDT which is divided into the two portions, whereby said longitudinally connected resonator type surface acoustic wave filter has a balanced-unbalanced conversion function;

each of said IDTs includes a chirp type electrode finger portion wherein the pitch of one electrode finger portion from an adjacent IDT-side end of said each IDT is linearly changed along the propagation direction of a surface acoustic wave; and the configuration of said chirp type electrode finger portion is different between a portion where the first and second IDTs are adjacent to each other, and a portion where the second and third IDTs are adjacent to each other.

19. A communication device including a longitudinally connected resonator type surface acoustic wave filter in accordance with any one of claims 1 through 18.

20. A longitudinally connected resonator type surface acoustic wave filter, comprising:

first, second and third IDTs successively arranged on a piezoelectric substrate along the propagation direction of a surface acoustic wave; wherein
the first and third IDTs have an opposite phase to the phase of the second IDT;
an unbalanced terminal extending from the second IDT and a balanced terminal extending from the first and third IDTs, whereby said longitudinally connected resonator type surface acoustic wave filter has a balanced-unbalanced conversion function;
each of the first, second and third IDTs includes a narrow-pitch electrode finger portion wherein the pitch of one electrode finger portion from the adjacent IDT-side end of said each IDT is made narrower than that of other electrode finger portions of the IDT; and
the intercentral distance of two adjacent electrode fingers between a narrow-pitch electrode finger portion and the electrode finger portion other than the narrow-pitch electrode finger portion are different on the opposite sides of the second IDT.

21. A longitudinally connected resonator type surface acoustic wave filter, comprising:

first, second and third IDTs successively arranged on a piezoelectric substrate along the propagation direction of a surface acoustic wave; wherein
the second IDT is divided into two portions, the first and third IDTs having an opposite phase to the phase of the second IDT, an unbalanced terminal extending from each of the first and third IDTs, and a pair of balanced terminals extending from the second IDT which is divided into the two portions, whereby said longitudinally connected resonator type surface acoustic wave filter has a balanced-unbalanced conversion function;
each of the first, second and third IDTs includes a narrow-pitch electrode finger portion wherein the pitch of one electrode finger portion from the adjacent IDT-side end of said each IDT is narrower than the pitch of the other electrode finger portion of the IDT; and
the intercentral distance of the two adjacent electrode fingers between the narrow-pitch electrode finger portion and the electrode finger portion other than the narrow-pitch electrode finger portion are different on opposite sides of the second IDT.

* * * * *